United States Patent [19]

Bronner et al.

[11] Patent Number: 5,128,271
[45] Date of Patent: Jul. 7, 1992

[54] HIGH PERFORMANCE VERTICAL BIPOLAR TRANSISTOR STRUCTURE VIA SELF-ALIGNING PROCESSING TECHNIQUES

[75] Inventors: Gary B. Bronner, Mt. Kisco; David L. Harame, Mohegan Lake, both of N.Y.; Mark E. Jost, Adliswill, Switzerland; Ronald N. Schulz, Salt Point, N.Y.

[73] Assignee: International Business Machines Corporation, Armonk, N.Y.

[21] Appl. No.: 608,508

[22] Filed: Nov. 2, 1990

Related U.S. Application Data

[62] Division of Ser. No. 298,385, Jan. 18, 1989, abandoned.

[51] Int. Cl.$^5$ .......................................... H01L 21/265
[52] U.S. Cl. ........................................ 437/31; 437/33; 437/67; 437/228; 148/DIG. 10; 148/DIG. 50
[58] Field of Search ............... 437/31, 67, 33, 228; 148/DIG. 10, DIG. 11, DIG. 50; 357/34

[56] References Cited

U.S. PATENT DOCUMENTS

| | | |
|---|---|---|
| 3,562,607 | 2/1971 | Lersel . |
| 4,333,794 | 6/1982 | Beyer et al. . |
| 4,617,724 | 10/1986 | Yokoyama et al. . |
| 4,731,341 | 3/1988 | Kawamatsu ........................ 437/33 |
| 4,783,422 | 10/1988 | Kawamatsu ........................ 437/33 |
| 4,800,171 | 1/1989 | Iranmanesh et al. ....... 148/DIG. 10 |
| 4,916,083 | 4/1990 | Monkowski ........................ 437/31 |
| 4,935,375 | 6/1990 | Kasper et al. ..................... 437/31 |
| 4,983,532 | 1/1991 | Mitani et al. ..................... 437/31 |
| 4,988,639 | 1/1991 | Aomura ............................ 437/67 |

FOREIGN PATENT DOCUMENTS 1764237  7/1971  Fed. Rep. of Germany .

*Primary Examiner*—Brian E. Hearn
*Assistant Examiner*—Kevin M. Picardat
*Attorney, Agent, or Firm*—Bernard E. Shay; David Aker

[57] ABSTRACT

The present invention is a self-aligned, vertical bipolar transistor structure and a method of manufacturing such a structure. Reducing lateral dimensions with optical lithography is difficult and not much is gained without concurrently reducing alignment tolerances. For bipolar transistors the alignment tolerance is particularly important since it determines the parasitic capacitances and resistances and thus directly affects speed. In this application a new fully self-aligned transistor structure is presented that self-aligns the shallow trench, extrinsic base contact, and the emitter polysilicon to the intrinsic device area. The structure has no critical alignments. To insure extrinsic-intrinsic base linkup the intrinsic base is put in early in the process, conserved during the stack etch, and patterned underneath the sidewall during the silicon mesa etch. Unlike other mesa-like transistor structures, no out-diffusion of the extrinsic-base is required and therefore low-temperature processing can be used to maintain a narrow vertical profile.

30 Claims, 21 Drawing Sheets

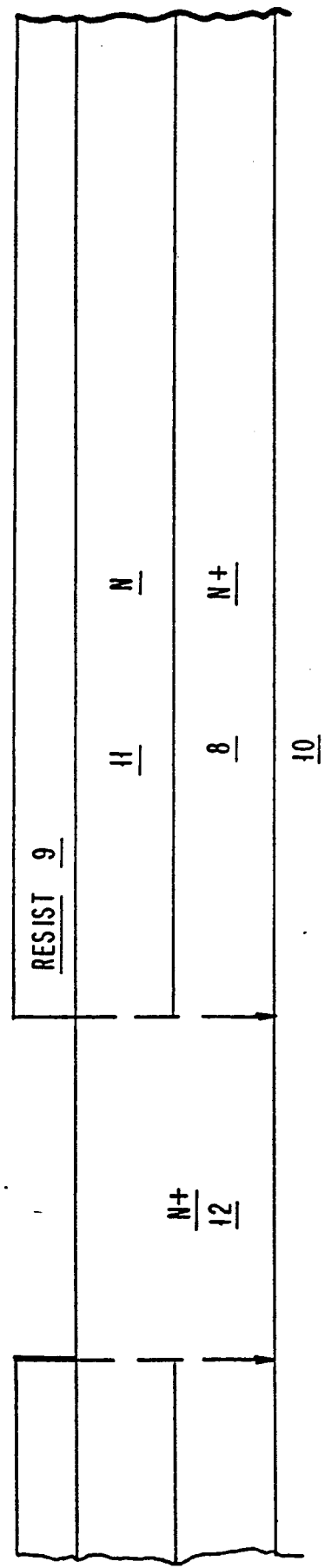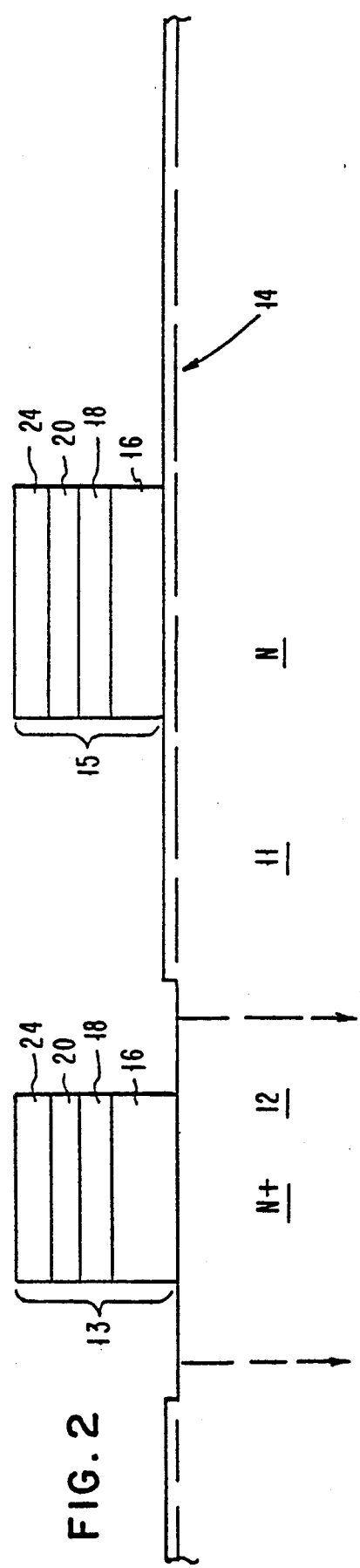

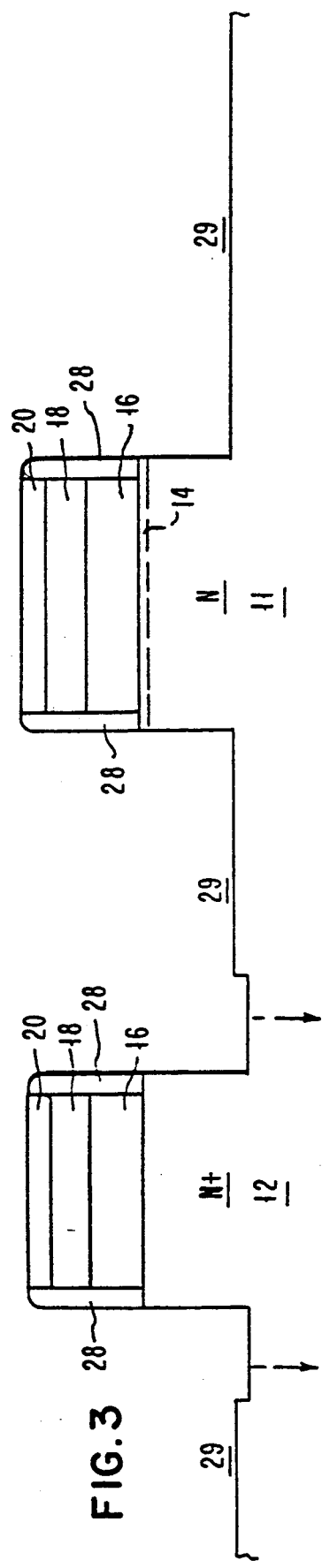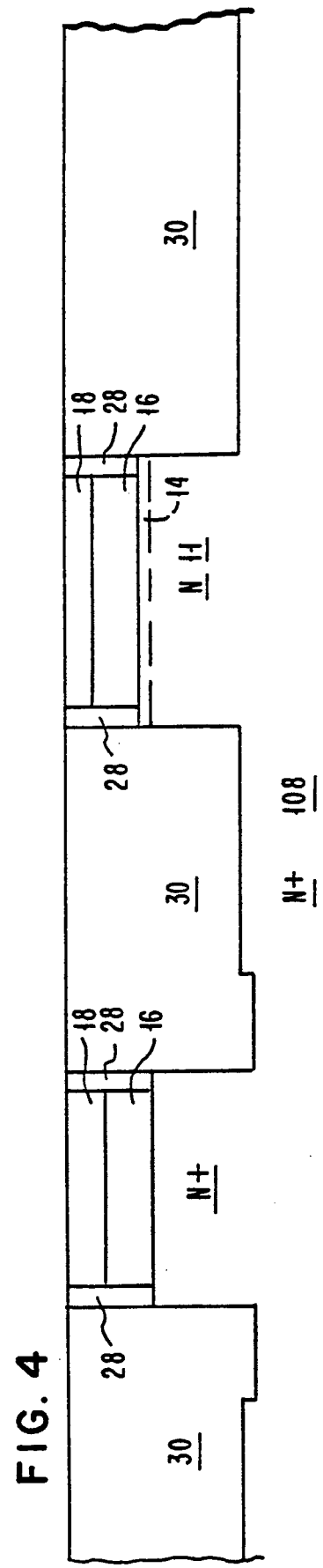

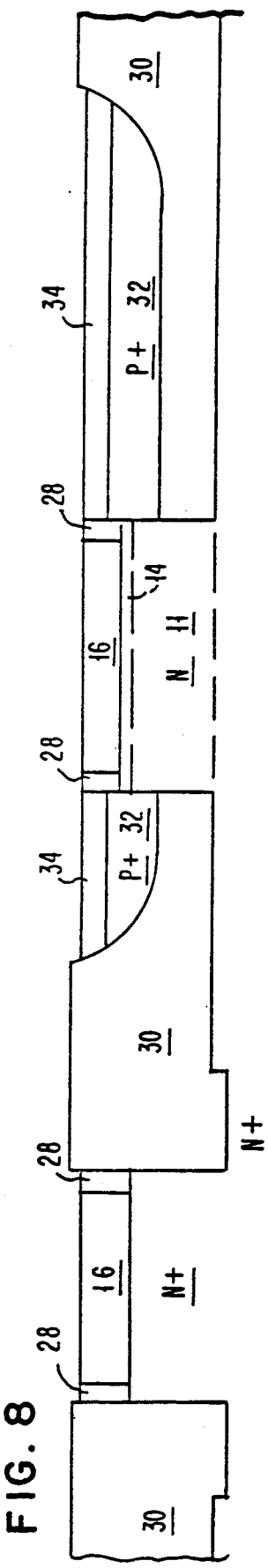

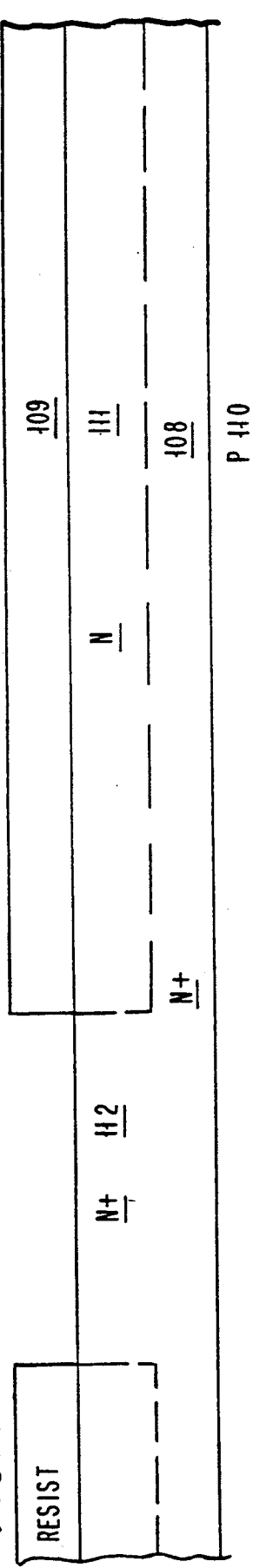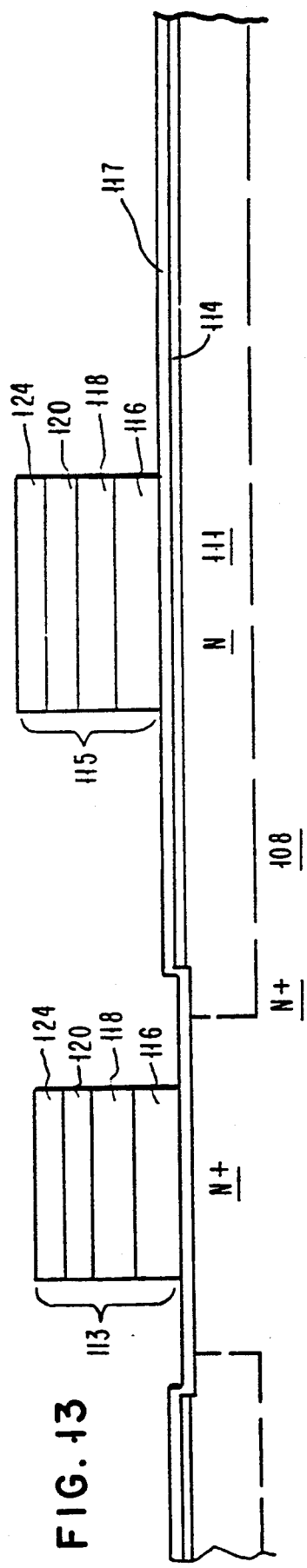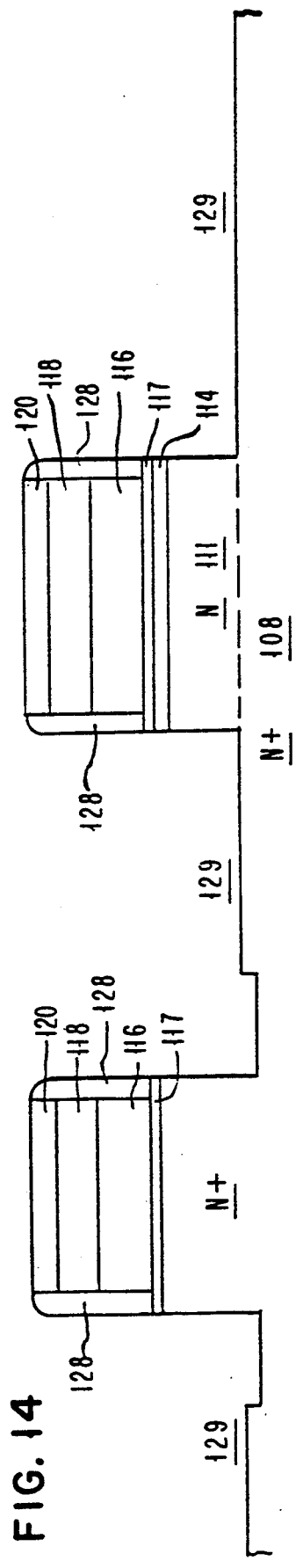

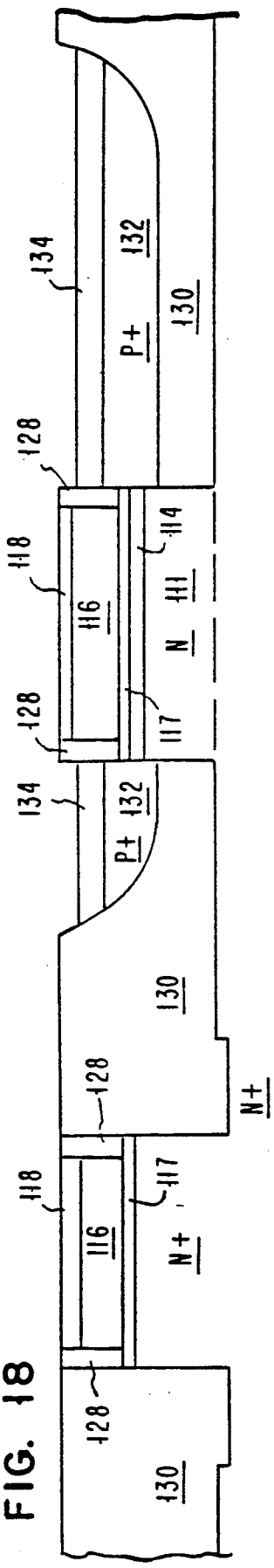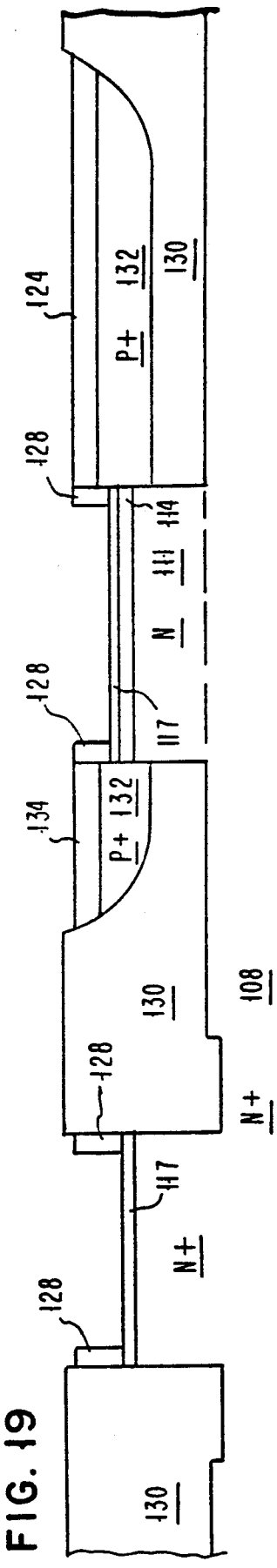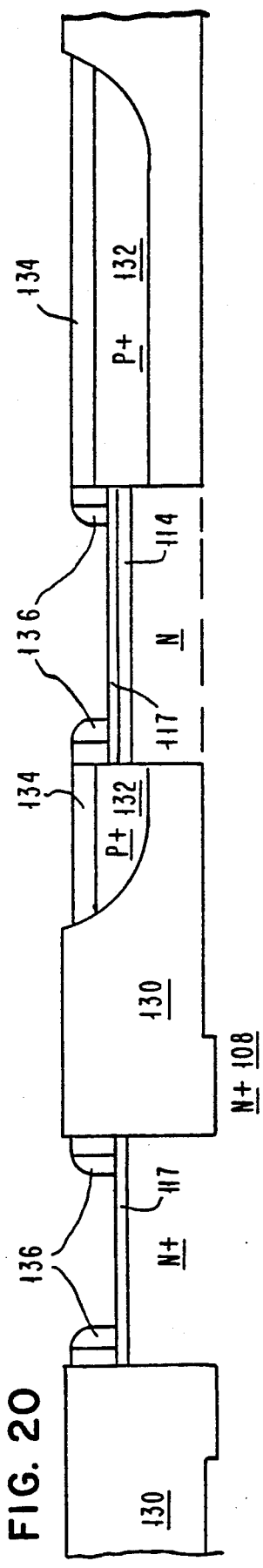

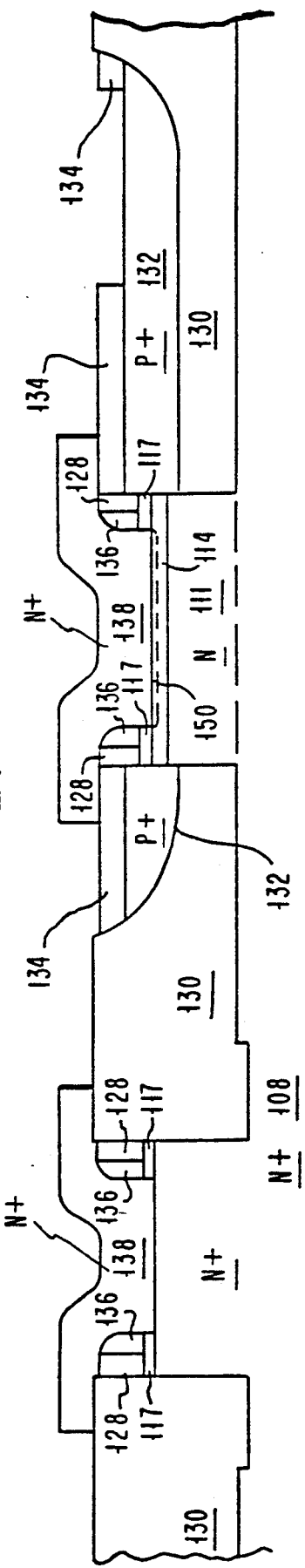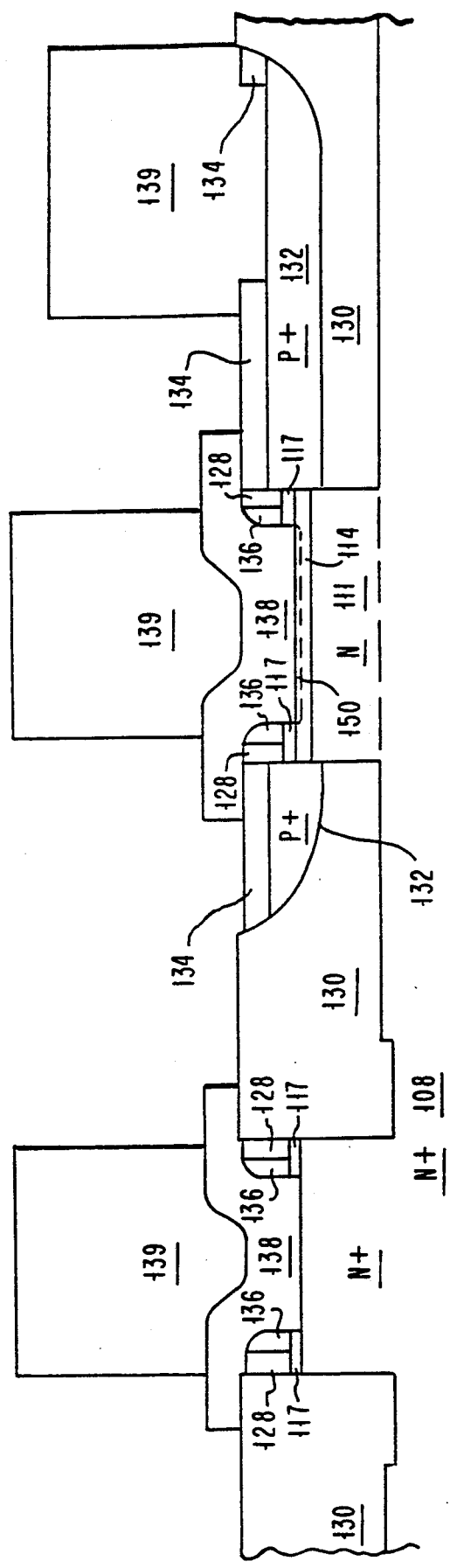

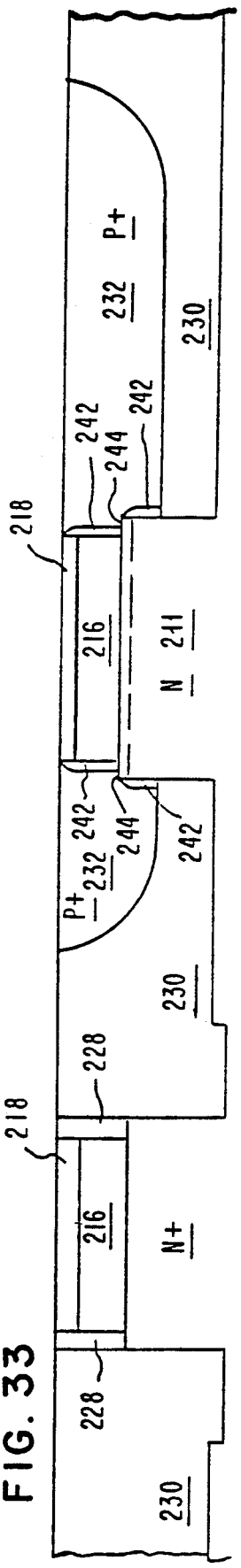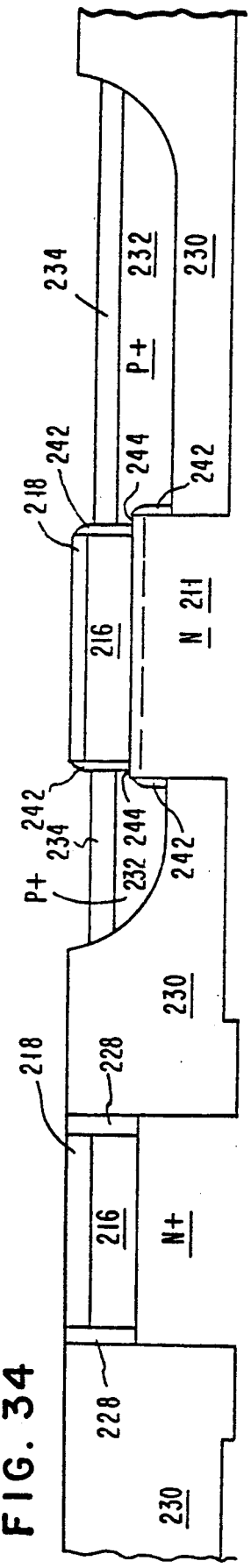

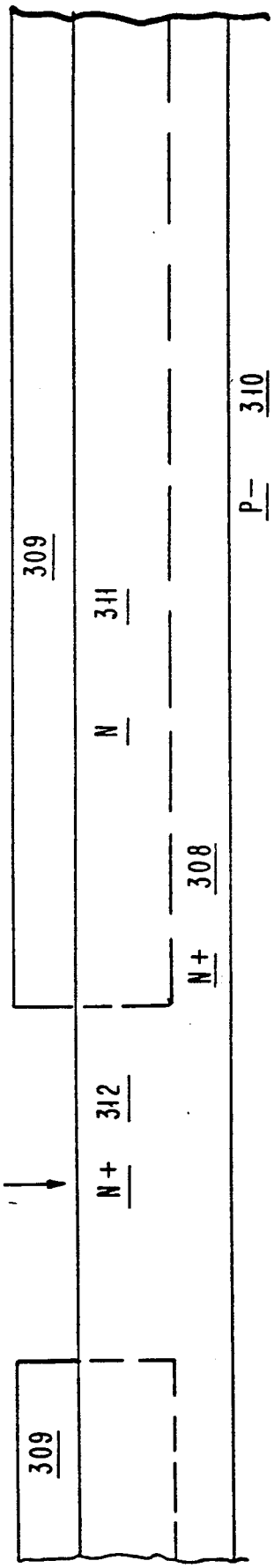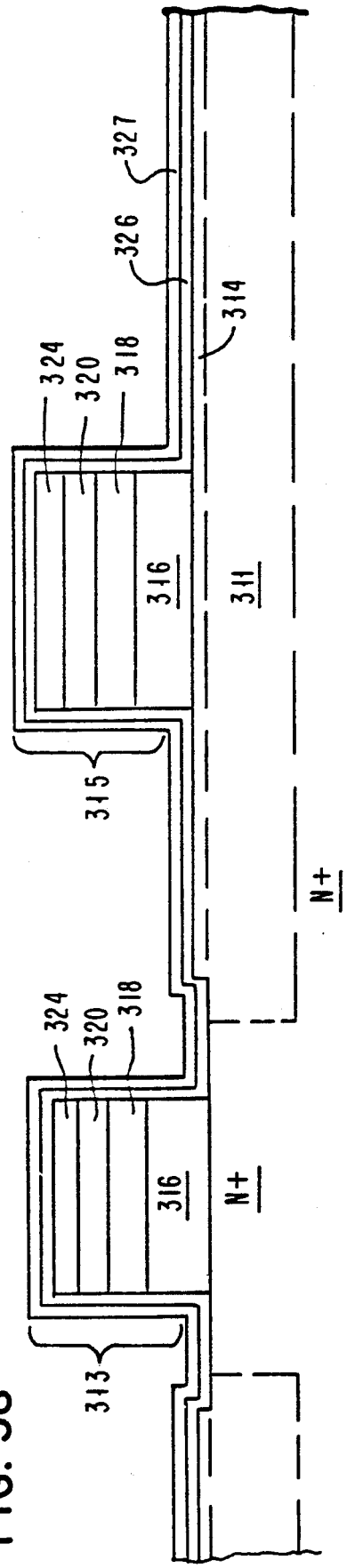
FIG. 37
FIG. 38

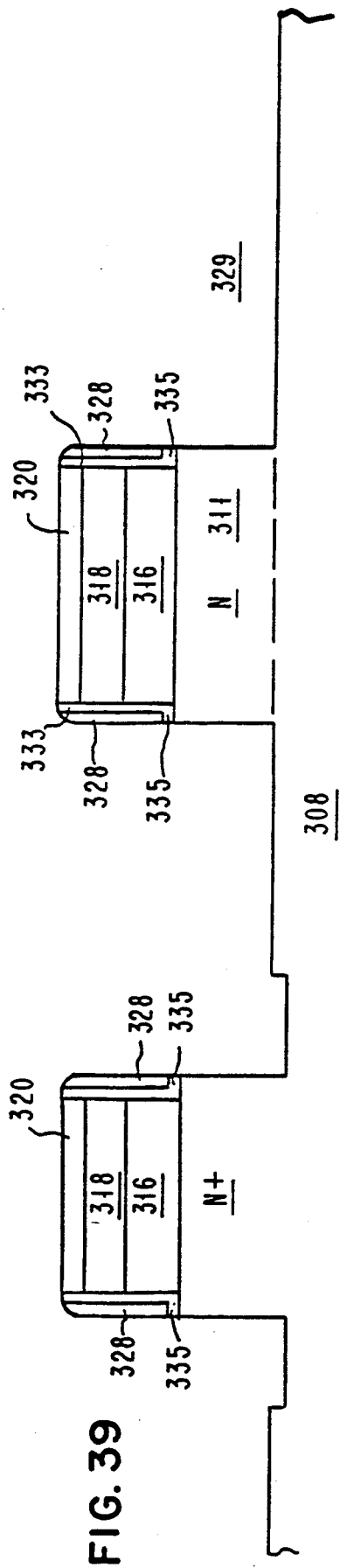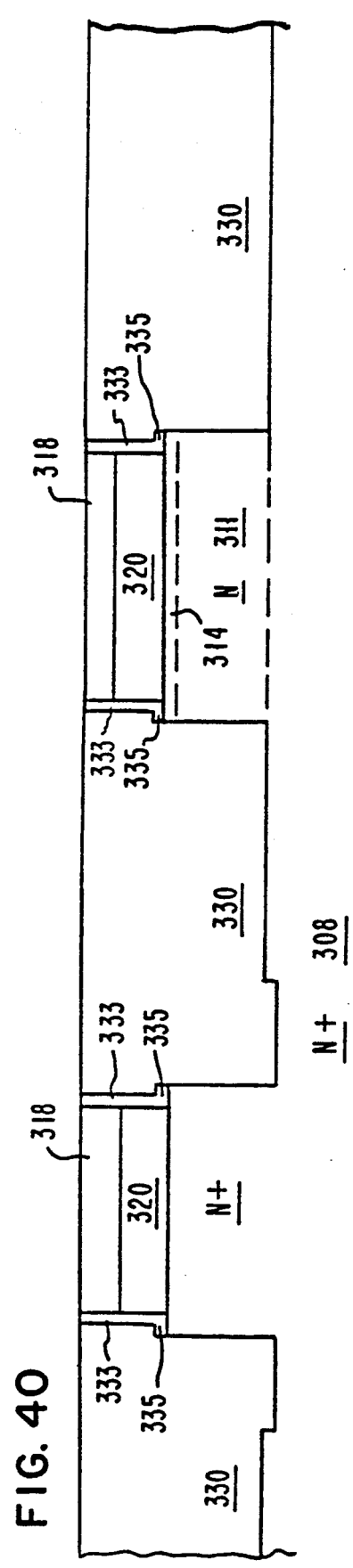

HIGH PERFORMANCE VERTICAL BIPOLAR TRANSISTOR STRUCTURE VIA SELF-ALIGNING PROCESSING TECHNIQUES

This is a division of application Ser. No. 07/298,385, filed Jan. 18, 1989 now continued as 07/609046 Nov. 2, 1990.

The present invention relates, in general, to high performance bipolar transistors and more particularly to a bipolar transistor structure with reduced parasitic base collector capacitance and a method of manufacturing such structures.

BACKGROUND OF THE INVENTION

The device described herein is intended to satisfy the requirements of high performance bipolar transistors. These requirements include base widths on the order of 600 Å self-aligned emitter and base contacts, and minimized parasitic capacitances. In addition, future bipolar transistors are expected to make increasing use of epitaxial techniques to improve the vertical profile. They also require a linkup with a minimal extrinsic base diffusion area to reduce the base-collector capacitance ($C_{bc}$) and base resistance ($R_b$). Other bipolar structures, such as the SELECT (Self-Aligned Edge Contact Technology) structure described in the article by Washio et al., published at the IEEE International Solid State Conference held on Feb. 25, 1987, have been devised to achieve similar goals, however, the present invention illustrates a unique and advantageous structure along with a unique and advantageous method of manufacturing such structures.

The SELECT structure is a species of SICOS (Sidewall Base Contact Structure) which is described in the article by Nakamura, et al., at pages 472–475 of IEDM, 1986.

However, SICOS based transistors suffer from processing problems. For example, the pad oxide between the extrinsic base polysilicon and collector, P substrate, is a fully thermal oxide. Because the subcollector of a SICOS transistor is patterned, the use of a fully thermal oxide will lead to thickness discrepancies between the thickness of the oxide located over the P substrate and the thickness of the oxide located over N+ subcollector, with the latter being as much as a factor of 2 thicker than the former. Therefore, there will be an increase in the extrinsic base P substrate capacitance.

In the SICOS structure, a LOCOS (Local Oxidation of Silicon as described in "Local Oxidation of Silicon and its Application in Semiconductor Device Technology," by J. A. Appels, E. Kooi, M. M. Paffen, J. J. H. Schatorje, and W. H. C. G. Verkuylen in *Philips Res. Rep.*, Vol. 25, p. 118, 1970) scheme is used to isolate the N collector from the extrinsic base polysilicon. In this scheme, a nitride layer is deposited on a thin pad oxide and patterned. A subsequent thermal oxidation forms the field oxide along with regions known in the art as a birds head and a birds beak. Prior to deposition of the extrinsic base polysilicon, the nitride/oxide is removed from the sides of the pedestal. The oxide must be "dipped" off in BHF (Buffered Hydrofluoric Acid). During this etch, due to the tapered birds beak, the exact position of the oxide/silicon boundary is not accurately known. Consequently, to ensure contact, there must be an excessive dip and a resultant "deep" extrinsic base contact on the side of the silicon pedestal. This has two undesired consequences. First, it expands the area of the extrinsic base/collector contact, increasing the capacitance of the device. Second, all high performance transistors require an increased collector concentration under the base. The implant must be patterned inside of the silicon pedestal to prevent a P+ extrinsic base/N collector implant junction from being formed. Failure to do this would increase the extrinsic base/collector capacitance and decrease the breakdown voltage of the transistor. Besides these processing problems, the structure is not fully self-aligned. In later versions of SICOS, as described by K. Washio et al. in "Fabrication Process and Device Characteristics of Sidewall Base Contact Structure Transistor Using Two-Step Oxidation of Sidewall Surface," *IEEE Transactions on Elect. Devices*, Vol. 35, No. 10, pp. 1596–1600 (October 1988), some of the processing problems were addressed but the structure is still not fully self-aligned.

A new, fully self-aligned device referred to as SDX has recently been described by Y. Yamamoto in *IEEE Transactions on Elect. Devices*, Vol. 35, No. 10, pp. 1601–1608 (1988). This process uses the diffusion of boron from the shallow trench oxide to self-align the extrinsic base contact. However, this process takes place at 900° C. for 30 minutes. This step will drive in a P++ diffusion deep into the pedestal and increase the base collector capacitance.

In U.S. Pat. No. 4,679,305 to Morizuka, a self-aligned GaAs bipolar transistor is described. In that device, the extrinsic base region is implanted before the self-aligned isolation region. Implantation of the extrinsic base early in the process in silicon technology would result in excessive vertical (deep junction) and lateral (emitter/base leakage) diffusion when subjected to the heat cycle of an integrated process. In addition, in that GaAs device, the isolation regions are formed by ion implantation, a technique which is not adaptable to silicon technology. In comparison, in the present invention the resulting structure is substantially improved by eliminating the interface between the extrinsic base and the emitter. In addition, the present invention provides a substantial reduction in the collector-to-extrinsic-base interface. Finally, the manufacturing process is simplified by eliminating at least one of the multiple sidewalls required to construct the Morizuka device.

SUMMARY OF THE INVENTION

The present invention is a high-speed transistor structure which does not share the deficiencies of either the SICOS or SDX designs, and novel processes for manufacturing such devices. Thus, a fully self-aligned, vertical, bipolar transistor is described. Distinguishing structural features of this transistor include an intrinsic base formed early in the process in blanket form, a self-aligned, shallow trench isolation, a self-aligned, extrinsic base region buried within the shallow trench isolation region and a fully self-aligned emitter. In addition, the process of manufacture provides advantages over prior art processing techniques. For example, the process is a "low-temperature" process capable of maintaining a narrow base profile throughout the process. In addition, the process provides a shallow base contact and, therefore, reduces batch $C_{bc}$ and $R_b$. The process is low temperature because all of the thermal oxidations in the process are done with high-pressure steam oxidation at or below 700° C.

In one embodiment of the present invention, the intrinsic base region may be formed by various techniques including epitaxy, implantation or diffusion. The intrinsic base is formed over a silicon substrate doped as a collector. An emitter mesa structure with a nitride sidewall is then formed over the intrinsic base. The field isolation area is formed using the sidewall film and the emitter stack as a reactive ion etch (RIE) mask. The selective RIE process etches a shallow trench which is subsequently filled with oxide and planarized. The extrinsic base region is formed by wet etching a well in the field isolation area which entirely encloses the emitter stack. The well is then filled with P+ poly and planarized. A portion of the original nitride sidewall remains to provide an isolation area between the emitter poly and the extrinsic base. The extrinsic base poly is recessed and a thermal oxidation is used to grow an insulating dielectric. The emitter is formed by diffusing arsenic out of the emitter poly into the single crystal silicon. The emitter anneal may consist of the heat cycle of the film depositions along with a short activation anneal, for example, an RTA (Rapid Thermal Anneal). Contact and metallization steps finish the process. The process has no critical alignments and only one critical lithographic step. The one critical lithographic step defines the minimum geometry of the emitter opening. A second, high-pressure oxide (HIPOX) process is also described, which includes an oxide etch stop layer to prevent etching of the base layer during the mesa etch.

It is an object of the present invention to provide a fully self-aligned, high-speed bipolar transistor.

It is a further object of the present invention to provide a fully self-aligned, high-speed bipolar transistor structure with a reduced base collector capacitance.

It is a further object of the present invention to provide a fully self-aligned, high-speed bipolar transistor structure including a thin, heavily doped intrinsic base.

It is a further object of the present invention to achieve a process for manufacturing a fully self-aligned, high-speed bipolar transistor structure.

It is a further object of the present invention to achieve a low-temperature process for manufacturing a fully self-aligned, high-speed bipolar transistor structure.

It is a further object of the present invention to achieve a process for manufacturing a fully self-aligned, high-speed bipolar transistor including a thin, heavily doped, epitaxially deposited intrinisic base.

It is a further object of the present invention to achieve a process for manufacturing a fully self-aligned, high-speed bipolar transistor with reduced base/collector capacitance and base resistance.

BRIEF DESCRIPTION OF THE DRAWINGS

The novel features of the invention are set forth with particularity in the appended claims. The invention itself, however, both as to organization and method of operation, together with further objects and advantages thereof, may best be understood by reference to the following description taken in conjunction with the accompanying drawings in which:

FIGS. 1-11 illustrate a method of manufacturing a high-speed transistor according to the present invention utilizing a Reactive Ion Etch (RIE) process.

FIGS. 12-22 illustrate a method of manufacturing a high-speed transistor according to the present invention, utilizing a HIPOX process.

FIGS. 31-36 illustrate a method of manufacturing a further embodiment of the present invention using the RIE process.

FIGS. 37-46 illustrate a method of manufacturing a further embodiment of the present invention using the RIE process.

DETAILED DESCRIPTION OF THE INVENTION

The essential process sequence of the RIE processing technique is as follows. The base is formed on bare N-epi/N+ subcollector/P-substrate with an annealed reach-through implant. A polysilicon layer is deposited by LPCVD Low-Pressure Chemical Vapor Deposition) followed by a series of sacrificial films. This stack is defined and etched to the P-type base layer. Sidewall formation and a silicon etch form the mesa. An oxide layer formed by the TEOS (Tetraethylorthosilane) process is deposited and planarized to form a shallow trench isolation around the mesa. TEOS is a chemical which breaks down to form $SiO_2$ in a deposition process. The extrinsic base is defined by etching a well into the shallow trench isolation, filling the well with LPCVD P+ in-situ doped polysilicon and planarizing. The P+ polysilicon is then recessed and oxidized. The top nitride is removed and the emitter polysilicon is doped. An emitter anneal (e.g., 850° C. for 20 min.) forms the emitter region, contact, and metallization follow.

The essential process sequence of the HIPOX (see, for example, "Low Temperature, High Pressure Steam Oxidation of Silicon," by L. E. Katz and B. F. Howells, Jr. in *J. Electrochem. Soc.*, Vol. 126, p. 1822, 1979, which is hereby incorporated by reference) alternative is as follows. The base is formed on bare N-epi/N+ subcollector/P-substrate with an annealed reach-through implant. A 100 Å etch stop oxide (ESOX) is grown by HIPOX (e.g., in 10 atmospheres of steam at 700° C.), followed by polysilicon and a series of sacrificial films. This stack is defined and etched to the ESOX. Sidewall formation and a silicon etch form a mesa. An oxide layer formed by the TEOS (Tetraethylorthosilane) process is deposited and planarized to form a shallow trench isolation around the mesa. The extrinsic base is defined by etching a well into the shallow trench isolation, filling with LPCVD deposited P+ in-situ doped polysilicon and planarizing. The P+ polysilicon is then recessed and oxidized. The top nitride, the sacrificial polysilicon and the ESOX are removed and emitter polysilicon deposited, doped and patterned. Emitter anneal (e.g., 850° C. for 20 min.), contact, and metallization steps follow.

In one preferred embodiment of the present invention, the device may be manufactured utilizing the RIE process option as follows. It should be noted that the present description is intended to illustrate construction of an NPN transistor; however, a PNP transistor could be constructed using the techniques described herein.

Figure 10:
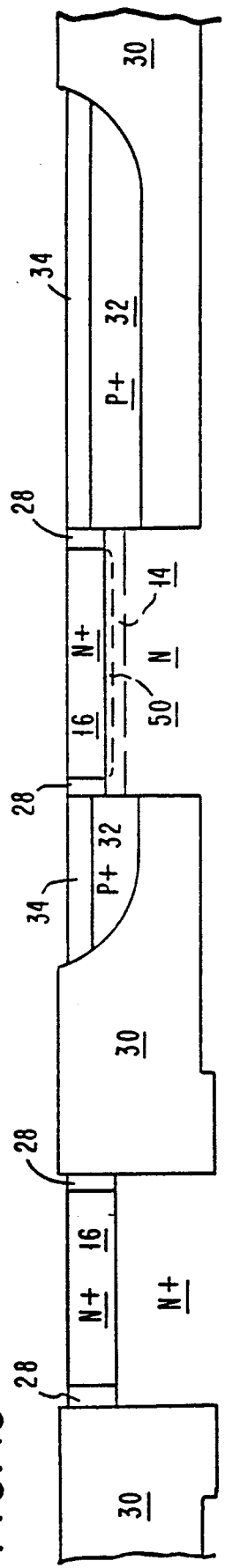
Figure 11:
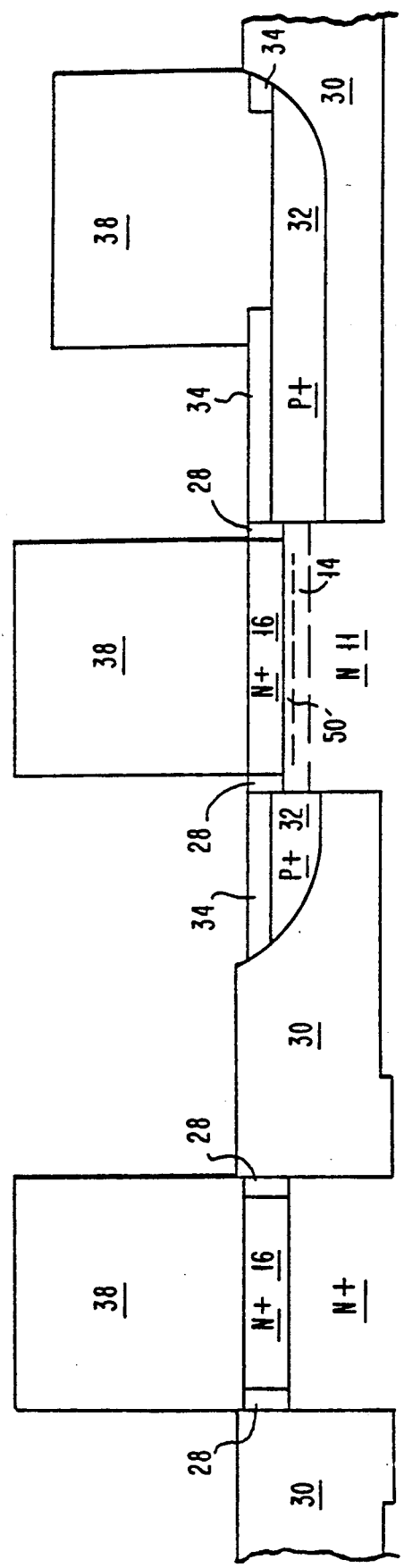

FIG. 11 illustrates one embodiment of the present invention constructed using the RIE option as illustrated in FIGS. 1-10.

In FIG. 1, a lightly doped P− wafer 10 is implanted with an N+ subcollector 8. N+ subcollector 8 is created by an ion implant followed by a drive-in and anneal. Layer 11 is formed over subcollector 8 by, for example, epitaxially depositing a layer of silicon doped with arsenic of approximately $3 \times 10^{16}$ atoms/cm$^3$ to a thickness of approximately 1.0 μm. Higher concentration collector profiles may also be used at this point in the process because of the low-temperature processing. Reach-through implant 12 is created by forming a resist 9 over the surface of N-epi layer 11 and opening the resist, using standard lithographic techniques, to expose a region of the surface of the N-epi (region 11). An ion implant of, for example, phosphorus, followed by an anneal may be used to create reach-through implant 12. Implant 12 has a depth sufficient to reach through to subcollector 8. At this point a higher concentration collector may also be deposited or formed by ion implantation. The purpose is to limit base width widening and reduce the collector series resistance. Because of the shallow base contact and low-temperature processing of the present invention, this higher doping may be established early in the process which prevents base width widening and enhances its operation as a high-speed switching transistor.

It should be noted that, while subcollector 8 and wafer 10 are not explicitly illustrated in the subsequent drawings, they remain a part of the device.

In FIG. 2, an intrinsic base is formed by depositing a doped layer 14 on the surface of layer 11 and selectively etching it over layer 12. Layer 14 may, for example, be a layer of Si or SiGe doped with boron or other known p-type dopants such as gallium. Layer 14 may be formed by any one of a number of known techniques such as implantation, diffusion or epitaxial deposition. However, in the preferred embodiment, layer 14 is deposited using an ultra-high vacuum, low-temperature epitaxy process (UHV/CVD LTE) on a bare silicon surface, such as is described in B. S. Meyerson, et al., *App. Phys. Lett.*, Vol. 50, p. 113 (1987), which is hereby incorporated by reference.

In FIG. 2, mesa structures 13 and 15 are constructed over reach-through layer 12 and base layer 14 by depositing a polysilicon emitter and collector contact layer 16 followed by a series of sacrificial layers (18, 20 and 24). The mesa structures are defined by lithographic techniques and etched to form structures 13 and 15. The first step in constructing such a mesa, according to the present embodiment, is to deposit a layer 16 of doped or undoped polysilicon (e.g., arsenic doped polysilicon) over base layer 14 using a Low-Pressure Chemical Vapor Deposition (LPCVD) process such as is described in "Low Pressure Silicon Epitaxy," by E. Krullmann and W. L. Engl in *IEEE Trans. Electron Dev.*, ED-29, 491 (1982), which is hereby incorporated by reference. Next, a first sacrificial layer 18 of, for example, Si$_3$N$_4$ is deposited over polysilicon layer 16 by an LPCVD process. In the embodiment of FIG. 2, a second sacrificial layer 20 may be deposited over first sacrificial layer 18, followed by a third sacrificial layer 24 deposited over second sacrificial layer 20. Second sacrificial layer 20 may be, for example, a layer of TEOS or an oxide deposited by other methods such as from silane and O$_2$, such as described in "The Deposition of Vitreous Silicon Dioxide from Silane," by N. Goldsmith and W. Kern in *RCA Rev.*, 28, 153 (1967), which is hereby incorporated by reference. Third sacrificial layer 24 may be, for example, a layer of LPCVD polysilicon or other deposited silicon layer. Each of layers 20 and 24 may be deposited by, for example, known LPCVD processes. The purpose of depositing layers 18, 20 and 24 is to put down sacrificial layers that will be removed during processing to allow for non-uniformity in the polish and etch steps.

It will be recognized by those skilled in the art that the mesa structures described herein may be built in a number of ways. For example, mesas 13 and 15 could be constructed using a first doped polysilicon layer, covered by a first layer of Si$_3$N$_4$. A second layer of polysilicon would cover the first layer of Si$_3$N$_4$ and a second layer of Si$_3$N$_4$ would cover the second layer of polysilicon, followed by a third layer of polysilicon. Finally, an SiO$_2$ pad might be inserted between the first polysilicon layer and the first Si$_3$N$_4$ to alleviate stress. In such a configuration, the second Si$_3$N$_4$ and second polysilicon region combine to perform the function performed by the second sacrificial layer 20 in the embodiments described herein.

Mesa structures 13 and 15 in FIG. 2 may be formed by, for example, a lithographically defined etch of layers 16, 18, 20 and 24. In such a procedure, patterned photoresist is used to define the emitter and collector regions. The photoresist acts as the mask and the sacrificial layers and polysilicon layer are anisotropically etched down to base layer 14 and implant 12 by, for example, a reactive ion etch which is described in "Reactive Ion Etching of Silicon," by G. C. Schwartz and P. M. Schaible in *J. Vac. Sci. Technol.*, 16, 410 (1979), which is hereby incorporated by reference. Mesa 13 is formed by etching to the surface of implant 12 and mesa 15 is formed by etching to the surface of base layer 14.

Once mesas 13 and 15 have been created, the entire surface of the wafer, including the mesa structures, is covered with a layer of, for example, Si$_3$N$_4$. This layer is then anisotropically etched by, for example, a reactive ion etch (RIE) which leaves sidewalls 28 surrounding mesa structures 13 and 15.

In FIG. 3, a second anisotropic etch removes a portion of layer 11 external to mesas 13 and 15, creating etched regions 29. This etch may be deep enough to expose a portion of subcollector 8, but that is not necessary. This etch is performed by a timed reactive ion etch of the silicon in the region surrounding mesas 13 and 15. Top polysilicon layer 24 is etched away during the shallow trench etch which forms etched regions 29.

In FIG. 4, etched regions 29 are filled to a height exceeding the height of first sacrificial layer 18 with an isolation material, for example, SiO$_2$ which isolates the vertical device and forms isolation regions 30. Once isolation regions 30 have been constructed, the wafer may be planarized using a planarization technique such as chem-mech polish, resist planarization or a combination of both techniques as described in "Planarization of Phosphorus Doped Silicon Dioxide," by A. C. Adams and C. D. Capio in *J. Electrochem. Soc.*, 128, 423 (1981), which is hereby incorporated by reference.

Figure 5:
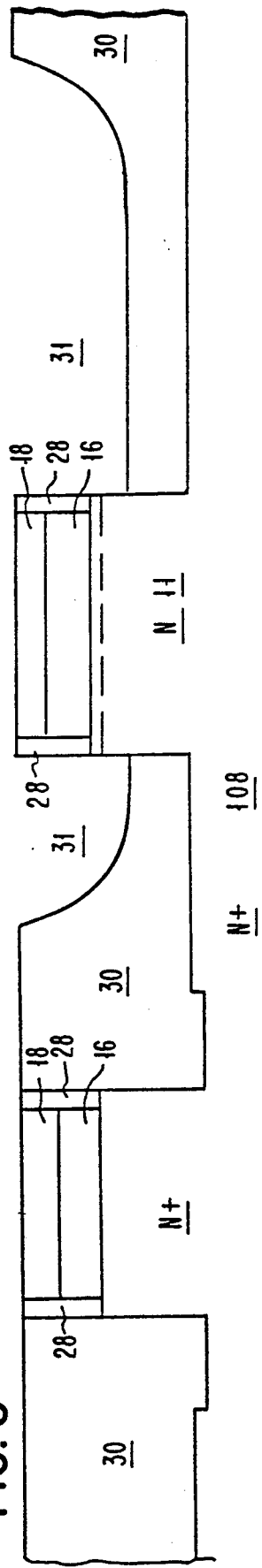

In FIG. 5, well 31 is etched to the depth which is at least sufficient to provide contact to layer 14 in order to provide contact between the intrinsic and extrinsic base regions. Well 31 is defined and etched in a non-critical alignment step using standard lithographic techniques. Well 31 may be created by either a buffered hydrofluoric acid wet etch or by another suitable etch method such as a highly selective RIE etch. A suitable HF wet etch is described in "A Study of the Dissolution of $SiO_2$ in Acidic Fluoride Solutions," by J. S. Judge in *J. Electrochem. Soc.*, 118, 1772 (1971) and in "Etch Rates of Doped Oxides in Solutions of Buffered HF," by A. S. Tenney and M. Ghezzo in *J. Electrochem. Soc.*, 120, 1091 (1973), which are hereby incorporated by reference.

Figure 6:
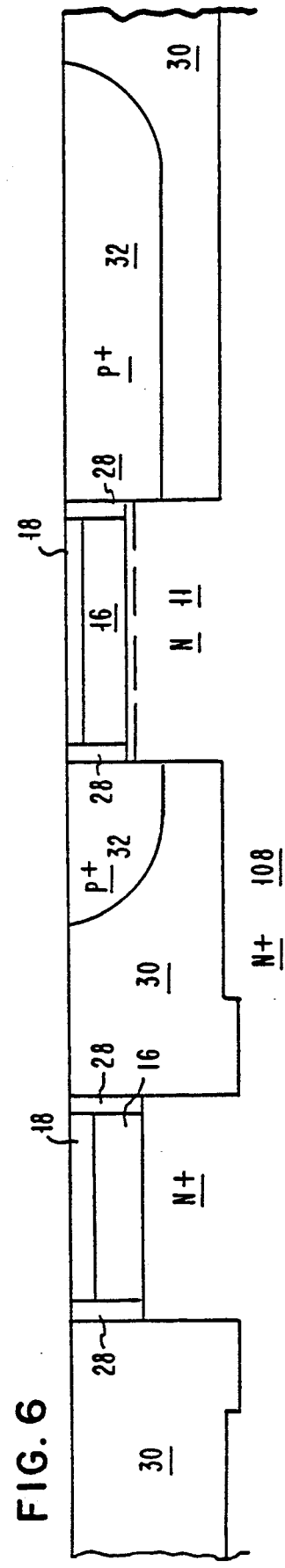

In FIG. 6, an in-situ doped P+ poly layer 32 may be deposited into well 31 to provide an extrinsic base region. Alternatively, undoped poly may be deposited, implanted and annealed. After the deposition of the P+ poly, the device may be planarized using a planarization technique as described above.

In FIG. 7, P+ polysilicon region 32 is recessed by, for example, an RIE etch. A HIPOX step is used to grow an insulating thermal oxide 34 over region 32. HIPOX is a thermal oxidation step which occurs at a low temperature (e.g., 700° C.) and allows the growth of a thick insulating oxide over the extrinsic base polysilicon without diffusing the intrinsic base. However, any suitable thermal oxidation process such as a wet thermal oxidation may be used to grow oxide 34.

In FIG. 8, first sacrificial layer 18 is removed by, for example, a reactive ion etch, leaving layer 16 exposed. At this point the emitter region may be doped by ion implantation of, for example, As into polysilicon layer 16.

In FIG. 9, emitter region 50 is formed when the emitter is annealed and arsenic is diffused into the single crystal silicon. This is advantageous because a suitable selection of anneal temperatures and times can result in shallow emitter with low emitter resistance. A possible problem might be the diffusion of the boron base dopant back into the polysilicon emitter region 50. This does not occur because a thin interfacial oxide remains under the poly and it is not broken down until this anneal, thus conserving the base, rather than consuming it.

FIG. 10 illustrates a complete device prior to contact etch and metallization.

In FIG. 11, contact to extrinsic base region 32 is made by lithographically defining a contact opening and etching region 34 to base region 32 using an RIE step. Metal contacts may then be formed using known lithographic techniques over collector contact 16, emitter contact 16 and extrinsic base region 32.

The HIPOX option, illustrated in FIGS. 12-22, is a process for manufacturing a device according to the present invention. This process is advantageous because it prevents the boron-doped extrinsic base area from being overetched during the original stack RIE which defines the mesa structure. This guarantees linkup (electrical) of the intrinsic base region to the extrinsic P+ poly base contact region. It also provides an oxide pad between the nitride and silicon to relieve strain that would occur with nitride directly on the silicon.

In FIG. 12, a lightly doped P− wafer 110 is implanted with an N+ subcollector 10B. N+ subcollector 108 is created by an ion implant followed by a drive-in and anneal. Layer 111 is formed over subcollector 108 by, for example, epitaxially depositing a layer of silicon doped with arsenic of approximately $1 \times 10^{16}$ atoms/cm$^3$ to a thickness of approximately 1.0 μm. Again, this layer may be doped to a higher concentration which is required for high-current operation and switching applications. Reach-through implant region 112 is created by forming a resist 109 over the surface of subcollector 108 and opening the resist, using standard lithographic techniques, to expose a region of the surface of the N-epi (region 111). An ion implant of, for example, phosphorus, followed by an anneal may be used to create reach-through implant region 112. Implant region 112 has a depth sufficient to reach through to subcollector 108.

An implant or epitaxial layer may be deposited at this point to increase the collector concentration and improve device performance. In FIG. 13, an intrinsic base is formed by depositing a doped layer 114 on the surface of layer 111 and selectively etching it over layer 112. Layer 114 may, for example, be a layer of Si or SiGe doped with boron or other known p-type dopants such as gallium. Layer 114 may be formed by any one of a number of known techniques such as implantation, diffusion or epitaxial deposition. However, in the preferred embodiment, layer 114 is deposited using an ultra-high vacuum, low-temperature epitaxy process (UHV/CVD LTE) on a bare silicon surface. Formation of base region 114 is followed by deposition of oxide layer 117. Oxide layer 117 may be deposited by any one of a number of known techniques, however, in the preferred embodiment, it is a 100 Å etch stop oxide grown by HIPOX.

In FIG. 13, mesa structures 113 and 115 are constructed over HIPOX layer 117 by depositing a polysilicon layer 116, followed by a series of sacrificial layers (118, 120 and 124). The mesa structures are defined by lithographic techniques and etched to the surface of HIPOX layer 117. The first step in constructing such a mesa, according to the present embodiment, is to deposit a layer 116 of undoped polysilicon over HIPOX layer 117 using a Low-Pressure Chemical Vapor Deposition (LPCVD) process. Next, a first sacrificial layer 118 of, for example, $Si_3N_4$ is deposited on polysilicon layer 116 by an LPCVD process. In the embodiment of FIG. 13, a second sacrificial layer 120 may be deposited on first sacrificial layer 118, followed by a third sacrificial layer 124 deposited on second sacrificial layer 120. Second sacrificial layer 120 may be, for example, a layer of TEOS or an oxide deposited by other methods such as from silane. Third sacrificial layer 124 may be, for example, a layer of LPCVD polysilicon or other deposited silicon layer. Each of layers 120 and 124 may be deposited by, for example, known LPCVD processes. The purpose of depositing layers 118, 120 and 124 is to put down sacrificial layers that will be removed during processing to allow for non-uniformity in the polish and etch steps. As previously discussed with reference to mesa structures, it will be recognized by those skilled in the art that the mesa structure may be built in a number of ways.

Mesa structures 113 and 115 may be formed by, for example, a lithographically defined etch of layers 116, 118, 120 and 124. In such a procedure, a patterned photoresist is used to define the emitter and collector regions. The photoresist acts as the mask and the sacrificial layers, photoresist and polysilicon layer are anisotropically etched down to HIPOX layer 117 by, for example, a reactive ion etch.

Once mesas 113 and 115 have been created, the entire surface of the wafer, including the mesa structures, is covered with a layer of, for example, Si₃N₄. This layer is then anisotropically etched by, for example, a reactive ion etch (RIE) which leaves sidewalls 128 surrounding mesa structures 113 and 115.

In FIG. 14, a second anisotropic etch removes a portion of layer 111 external to mesas 113 and 115, creating etched regions 129. This etch may be deep enough to expose a portion of subcollector 108, but that is not necessary. This etch is performed by a timed reactive ion etch of the silicon in the region surrounding mesas 113 and 115. Layer 124 is also etched during the creation of region 129.

Figure 15:
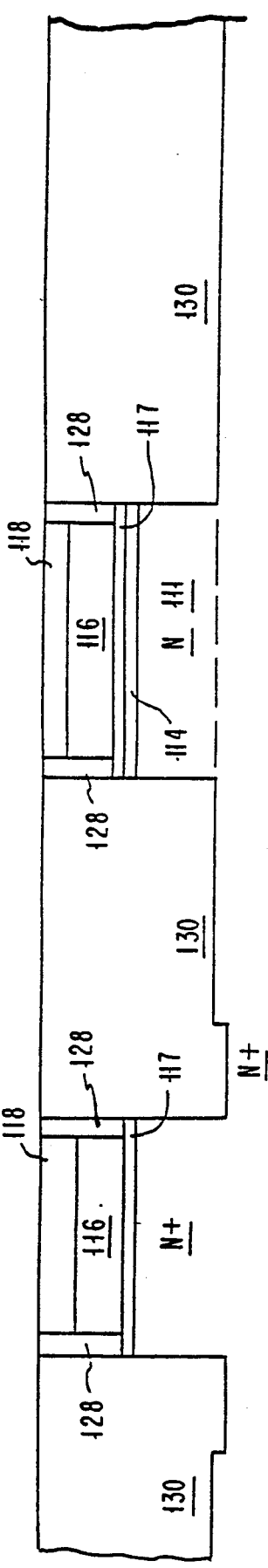

In FIG. 15, etched regions 129 are filled to a height exceeding the height of first sacrificial layer 118 with an isolation material, for example, $SiO_2$ (e.g. TEOS deposited $SiO_2$), which isolates the vertical device and forms isolation region 130. Once isolation region 130 has been constructed, the wafer may be planarized using a planarization technique such as chem-mech polish, resist planarization or a combination of both techniques.

Figure 16:
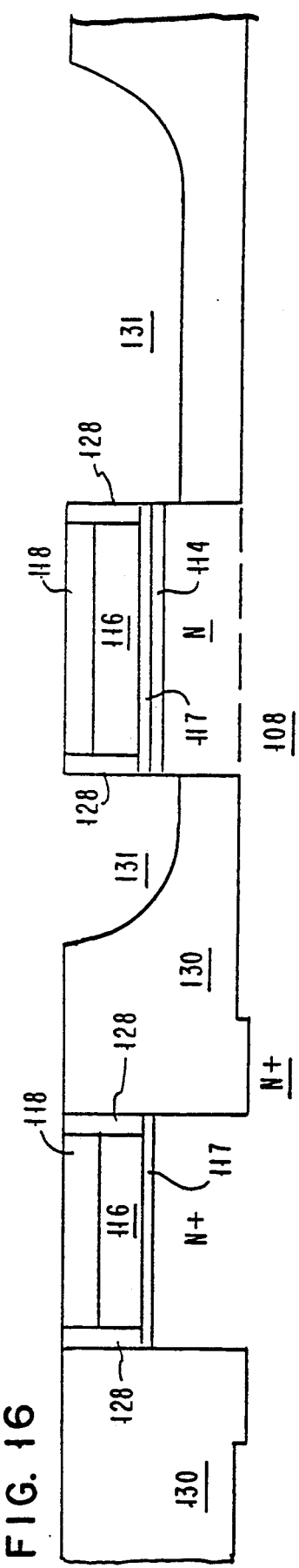

In FIG. 16, well 131 is etched to a depth which is at least sufficient to provide contact to layer 114 in order to provide contact between the intrinsic and extrinsic base regions. Well 131 may be created by either a buffered hydrofluoric acid wet etch or by another suitable etch method such as a highly selective RIE etch.

Figure 17:
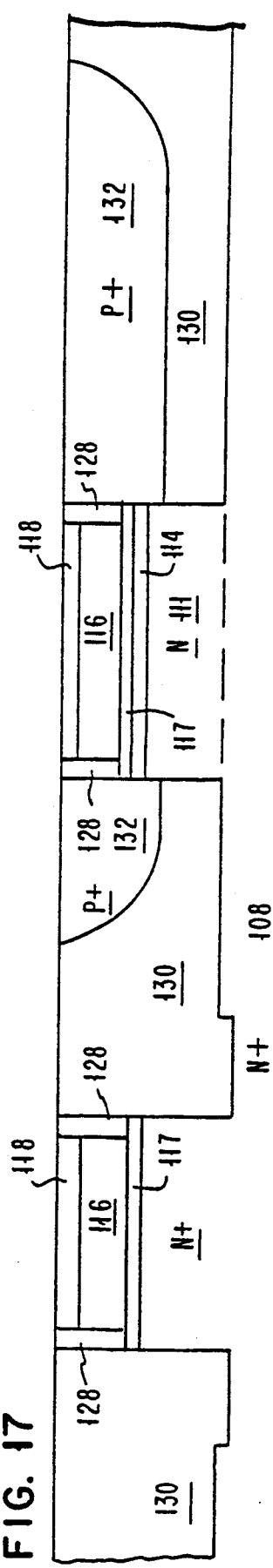

In FIG. 17, an in-situ doped P+ poly layer 132 may be deposited into well 131 to provide an extrinsic base region. Alternatively, undoped poly may be deposited, implanted and annealed. After deposition of the P+ poly, the device may be planarized using a planarization technique as described above.

In FIG. 18, P+ polysilicon region 132 is recessed by, for example, an RIE etch. A HIPOX step is used to grow an insulating thermal oxide 134 over region 132. HIPOX allows the growth of the oxide without diffusing the base. Any thermal oxidation step may be used to grow oxide layer 134.

In FIG. 19, first sacrificial layer 118 and polysilicon layer 116 are removed by, for example, reactive ion etching and selective wet etching, respectively, leaving HIPOX layer 117 and the remaining portion of sidewalls 128 exposed. A second sidewall (which can reduce the emitter area) layer of, for example, Si₃N₄ may be deposited over the entire surface of the device by, for example, an LPCVD process. This layer is then anisotropically etched to form interior sidewalls 136. FIG. 20 illustrates a device including interior sidewalls 136. Interior sidewalls are advantageous and may be desirable because they reduce the region of the diffused emitter. The collector concentration can be increased by ion-implanting phosphorus and annealing this implant. This would self-align the collector dopant but result in broadening the base during this collector implant anneal.

In FIG. 21, contact 138 is deposited over the surface of the device and lithographically removed except in those regions overlying the collector and emitter. Contact 138 may, for example, be a layer of polysilicon doped N+ with an arsenic dopant. Emitter region 150 is formed as was described with respect to FIG. 9. Emitter region 150 could also be formed by implantation prior to depositing contact 138, but this is not the preferred method.

In FIG. 22, contact to extrinsic base region 132 is made by lithographically defining a contact opening and etching region 134 to region 132 using an RIE step. Metal contacts 139 may then be formed using known lithographic techniques over contact 138.

Another option is to omit low-temperature epi base 14 at step 2 and implant the intrinsic base prior to depositing a second poly to form emitter contact 16. In this embodiment, a base anneal would preceed the emitter polysilicon deposition. This will remove the temperature constraints caused by putting the intrinsic base in so early in the process. The intrinsic base implant could also be preceded by an inward sidewall technology to reduce emitter size.

Figure 23:
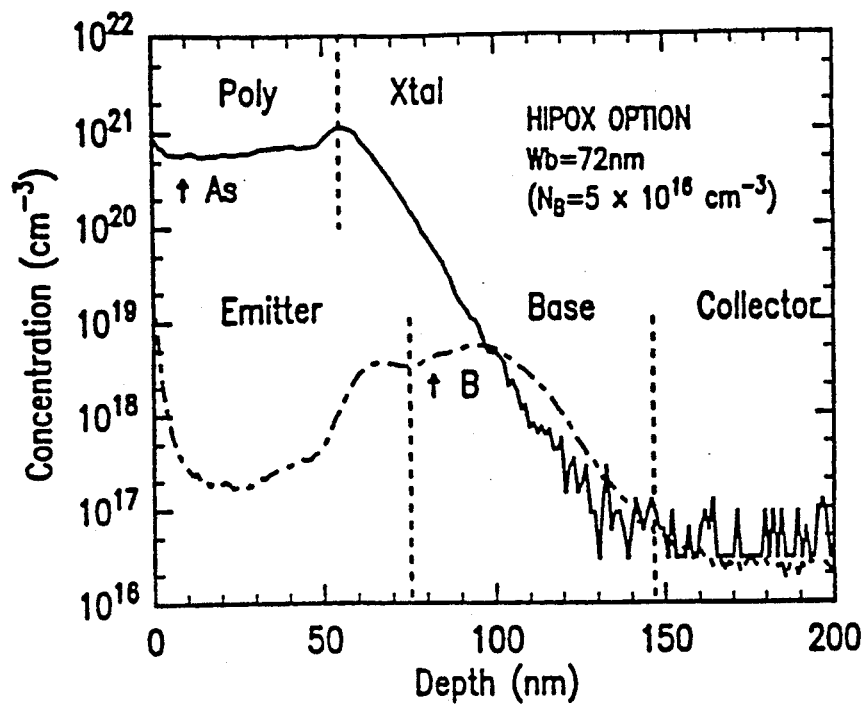
FIG. 23 is a SIMS profile for a high-speed transistor constructed utilizing the HIPOX process.

The SIMS (Secondary Ion Mass Spectroscopy) profile for a transistor constructed according to the HIPOX option of the present invention is shown in FIG. 23. Note that the metallurgical base width, measured from the notch in the base profile to a collector concentration of $5 \times 10^{16}$ was $\simeq 700$ Å. The subcollector was spaced 1.0 μm from the final intrinsic base/collector junction. The base concentration at the emitter/base junction is approximately $1 \times 10^{18}$ atoms/cm³.

Figure 24:
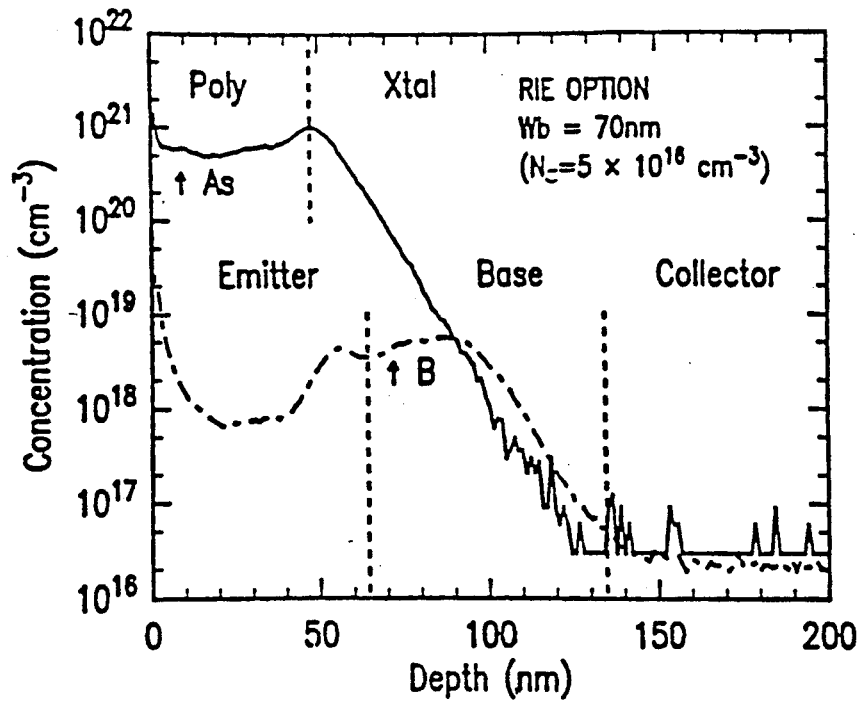
FIG. 24 is a SIMS profile for a high-speed transistor constructed utilizing the RIE process.

The SIMS profile for a transistor constructed according to the RIE option of the present invention is illustrated in FIG. 24. This SIMS profile was very similar to the HIPOX option SIMS profile.

This is supportive evidence that during the low-temperature HIPOX processing, this interfacial oxide under layer 16 is not broken down and the boron from the epitaxial base does not diffuse into the undoped polysilicon. When the polysilicon is doped later in the process and is annealed, the dopant diffuses out into the single crystal and some boron diffuses into the polysilicon, as in the HIPOX option.

Figure 27:
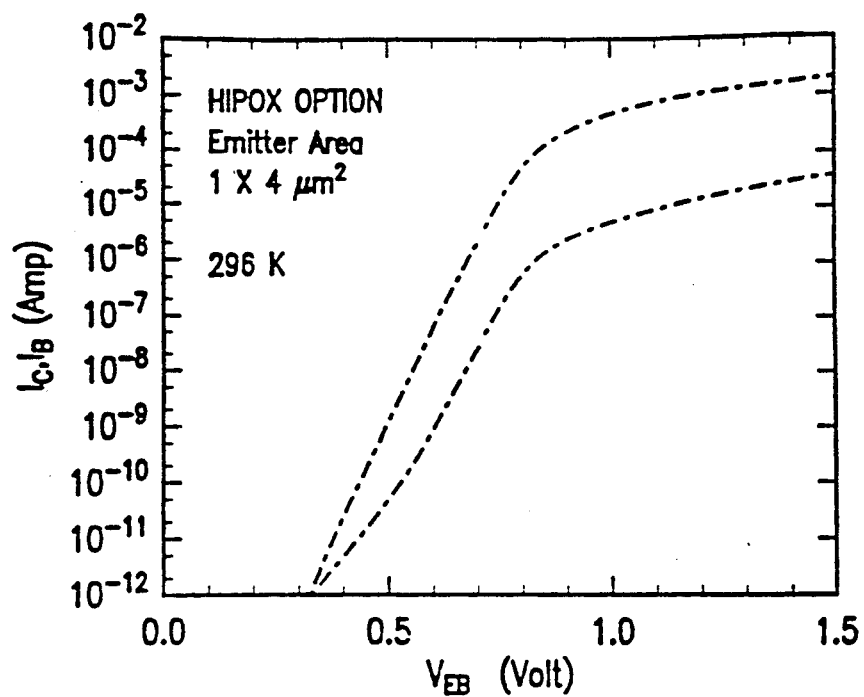
FIG. 27 is a Gummel plot for a high-speed transistor constructed using the HIPOX process.
Figure 29:
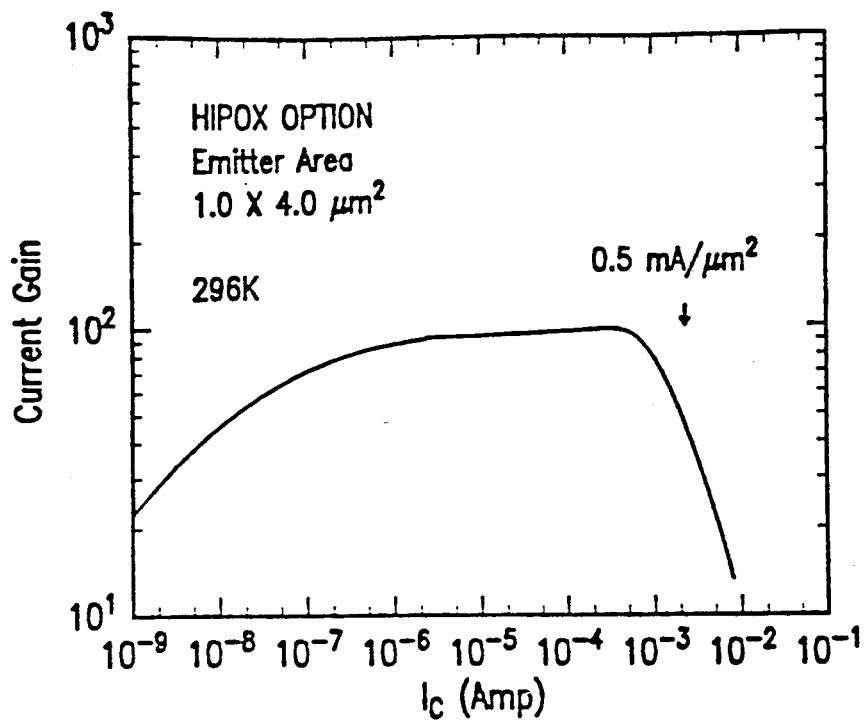
FIG. 29 is a plot of current gain vs. collector current for a high-speed transistor according to the present invention constructed using the HIPOX process.

A Gummel plot for a $1.0 \times 4.0$ μm emitter HIPOX option transistor is shown in FIG. 27. The device characteristics are close to ideal except for a non-ideal base current at low bias. The base sheet resistance is less than about 10 kΩ per square. The current gain versus collector current is shown in FIG. 29. Note that the current roll-off is less than 0.5 mA/μm² due to the low collector doping. The current roll-off can be easily increased to a value above 0.5 mA/μ² by increasing the collector doping. This increase in doping may be done at an early point in the process, before the epitaxial base is deposited by either ion implant oxide anneal or as a part of the N epitaxial layer deposited on top of the N+ subcollector. The low-temperature processing aspects of the present invention make this step possible. It would not be possible in other structures like SDX and SIMS, which do not have a shallow contact, without substantially increasing the capacitance.

Figure 28:
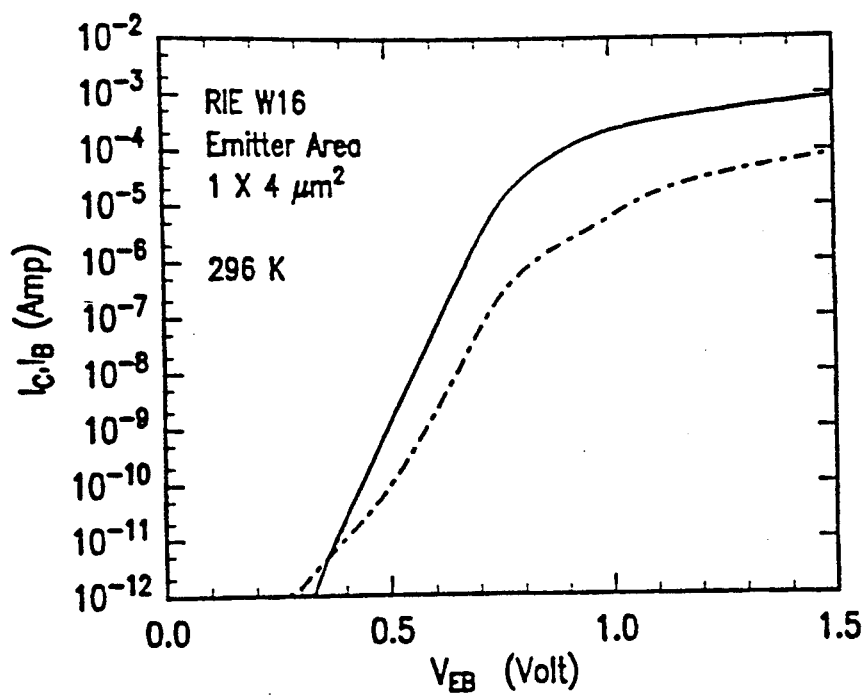
FIG. 28 is a Gummel plot for a high-speed transistor according to the present invention constructed using the RIE process.
Figure 30:
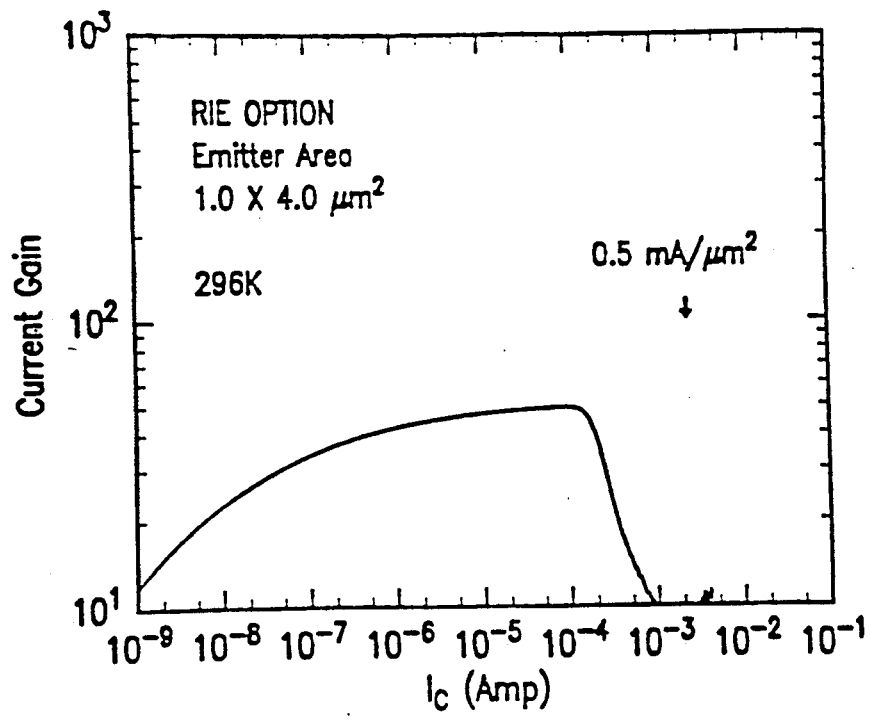
FIG. 30 is a plot of current gain vs. collector current for a high-speed transistor according to the present invention constructed using the RIE process.

A Gummel plot for a $1.0 \times 4.0$ μm² emitter RIE option transistor is illustrated in FIG. 28. The current gain vs. collector current is illustrated in FIG. 30.

Figure 31:
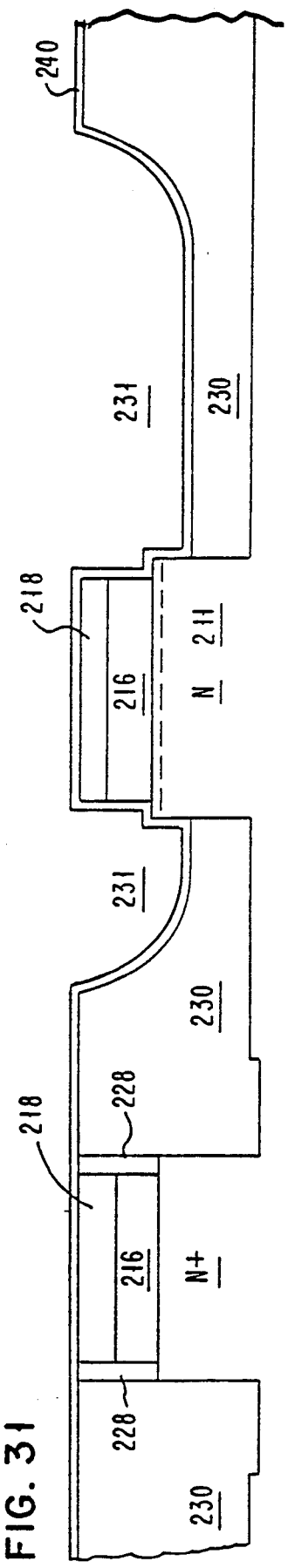
Figure 35:
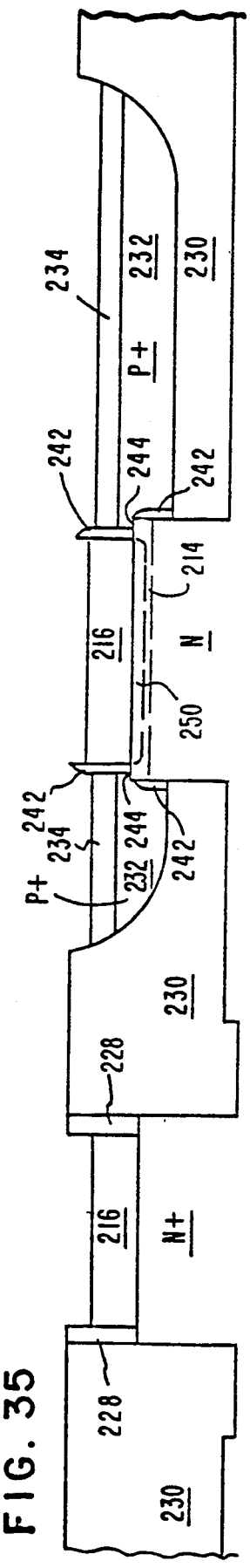
Figure 36:
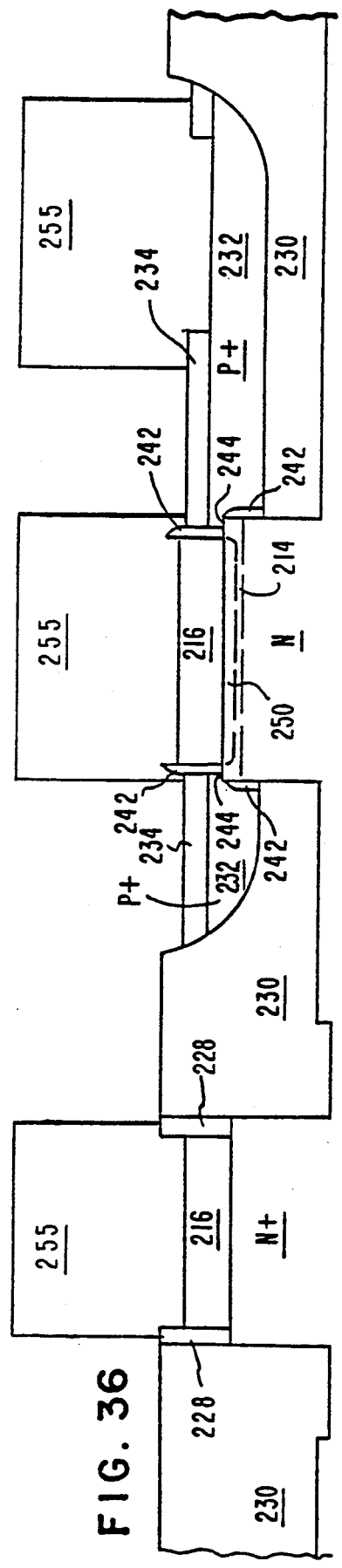

FIG. 36 illustrates an alternative embodiment of the present invention constructed according to the method illustrated in FIGS. 1–5 and 31–36. The embodiment of FIG. 36 is constructed substantially as described with reference to FIGS. 1–5, except that sidewall region 28, illustrated in FIGS. 1–5 is an oxide (e.g., $SiO_2$) rather than a nitride. This sidewall is illustrated in FIG. 31 by sidewalls 228. In FIG. 31, sidewalls 228 along with the portion of isolation region 230 which forms well 231 have been removed from mesa 215 by, for example, a hydrofluoric wet etch as described above.

In FIG. 31, a thin layer 240 of, for example, TEOS is deposited over isolation region 230, mesas 13 and 15 and well 231 by, for example, an LPCVD process.

Figure 32:
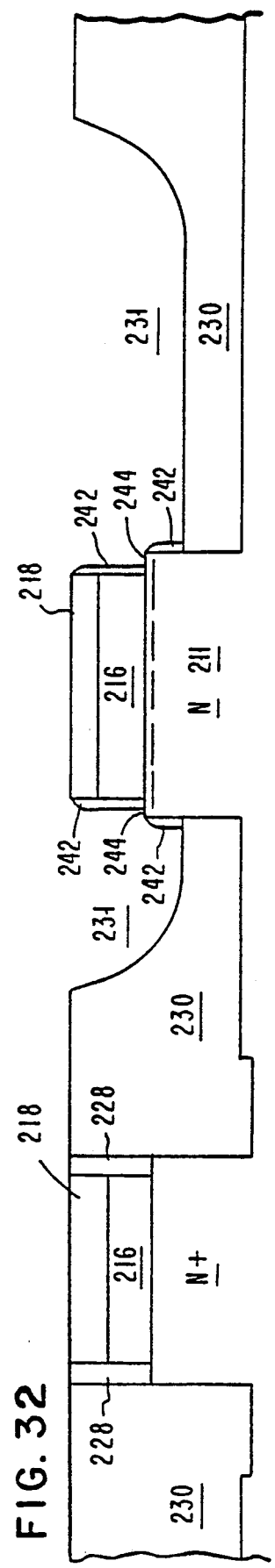

In FIG. 32, an RIE etch is used to form oxide sidewalls 242. After this RIE etch, a contact shoulders 244 of base region 214 is exposed.

In FIG. 33, a layer of, for example, in-situ doped poly 232 may be deposited into well 231 to provide an extrinsic base region. Alternatively, undoped poly may be deposited, implanted and annealed. After the deposition of the poly, the device may be planarized using a planarizaton technique as described above. Electrical contact between extrinsic base 232 and intrinsic base 214 is made through contact shoulder 244.

In FIG. 34, P+ polysilicon region 232 is recessed by, for example, an RIE etch. A HIPOX step is used to grow an insulating thermal oxide 234 over region 232. The use of a HIPOX process to grow thermal oxide 234 allows the growth of the oxide without diffusing the base. However, any suitable thermal oxidation process may be used to grow oxide 234.

In FIG. 35, first sacrificial layer 218 has been removed by, for example, RIE etch to expose collector and emitter contact polysilicon layer 216. Since contact 216 is preferably a doped polysilicon layer (e.g., N+ layer doped with arsenic) emitter region 250 may be formed, as was described with respect to FIG. 9.

In FIG. 36, contact to extrinsic base region 232 is made by lithographically defining a contact opening and etching region 234 to region 232 using an RIE step. Metal contacts 255 may then be formed using known lithographic techniques over regions 216 and 232.

In FIG. 37, a lightly doped P− wafer 310 is implanted with an N+ subcollector 308. N+ subcollector 308 is created by an ion implant followed by a drive-in and anneal. Layer 311 is formed over subcollector 308 by, for example, epitaxially depositing a layer of silicon doped with arsenic of approximately $3 \times 10^{16}$ atoms/cm$^3$ to a thickness of approximately 1.2 μm. Reach-through implant 312 is created by forming a resist 309 over the surface of subcollector 308 and opening the resist, using standard lithographic techniques, to expose a region of the surface of the N-epi (region 311). An ion implant of, for example, phosphorus, followed by an anneal may be used to create reach-through implant 312. Implant 312 has a depth sufficient to reach through to subcollector 308.

In FIG. 38, an intrinsic base is formed by depositing a doped layer 314 on layer 311 and removing the portion above collector implant 312 using an RIE etch. Layer 314 may, for example, be a layer of Si or SiGe doped with boron or other known p-type dopants such as gallium. Layer 314 may be formed by any one of a number of known techniques such as implantation, diffusion or epitaxial deposition. However, in the preferred embodiment, layer 314 is deposited using an ultra-high vacuum, low temperature epitaxy process (UHV/CVD LTE) on a bare silicon surface.

In FIG. 38, mesa structures 313 and 315 are constructed over base layer 314 by depositing a polysilicon emitter and collector contact layer 316 followed by a series of sacrificial layers (318, 320 and 324). The mesa structures are defined by lithographic techniques and etched to the surface of base 314. The first step in constructing such a mesa, according to the present embodiment, is to deposit a layer 316 of doped or undoped polysilicon (e.g., arsenic doped polysilicon) over base layer 314 using a Low-Pressure Chemical Vapor Deposition (LPCVD) process. Next, a first sacrificial layer 318 of, for example, Si$_3$N$_4$ is grown over polysilicon layer 316 by an LPCVD process. In the embodiment of FIG. 38, a second sacrificial layer 320 may be deposited over first sacrificial layer 318, followed by a third sacrificial layer 324 deposited over second sacrificial layer 320. Second sacrificial layer 320 may be, for example, a layer of TEOS-deposited oxide or an oxide deposited by other methods such as from silane. Third sacrificial layer 324 may be, for example, a layer of LPCVD polysilicon or other deposited silicon layer. Each of layers 320 and 324 may be deposited by, for example, known LPCVD processes. The purpose of depositing layers 318, 320 and 324 is to put down sacrificial layers that will be removed during processing to allow for non-uniformity in the polish and etch steps.

Mesa structures 313 and 315 may be formed by, for example, a lithographic etch of layers 316, 318, 320 and 324. In such a procedure, a photoresist covers polysilicon layer 324 and a mask is used to expose the regions overlying the emitter and collector connections. The photoresist is then exposed and the sacrificial layers, photoresist and polysilicon layer are anisotropically etched down to base layer 314 and implant 312. Mesa 313 is formed by etching to the surface of implant 312, and mesa 315 is formed by etching to the surface of base layer 314.

In FIG. 38, a first layer 326 of, for example, nitride (e.g., Si$_3$N$_4$) is deposited over the surface of pedestal 313, pedestal 315, base region 314 and reach-through implant 312 by, for example, an LPCVD process. Deposition of first layer 326 is followed by deposition of second layer 327 of, for example, an oxide (e.g., SiO$_2$) by, for example, an LPCVD process over the surface of first layer 326. After depositing layer 327, it is anisotropically etched to the surface of layer 326, forming sidewalls 328. Pedestal 333 is formed by anisotropically etching first layer 326. Because sidewall 328 acts as an etch mask, this second anisotropic etch forms a pedestal foot 335 below sidewall 328 as illustrated in FIG. 39.

In FIG. 39, a further anisotropic etch removes a portion of layer 311 external to mesas 313 and 315, creating etched regions 329. This etch may be deep enough to expose a portion of subcollector 308, but that is not necessary. This etch may be performed by a timed reactive ion etch of the silicon in the region surrounding mesas 313 and 315, with sidewall 328 and pedestal 333 acting as an etch mask. Top polysilicon layer 324 is etched away during the shallow trench etch which forms region 329.

In FIG. 40, etched regions 329 are filled to a height exceeding the height of first sacrificial layer 318 with an isolation material, for example, SiO$_2$ which isolates the vertical device and forms isolation region 330. Once isolation region 330 has been constructed, the wafer may be planarized using a planarization technique such as chem-mech polish, resist planarization or a combination of both techniques. In the embodiment of FIG. 40, sidewall 328 is formed of the same material as isolation region 330 (e.g., SiO$_2$), and is therefore included as part of isolation region 330. Well 331 is defined by a non-critical masking step.

Figure 41:
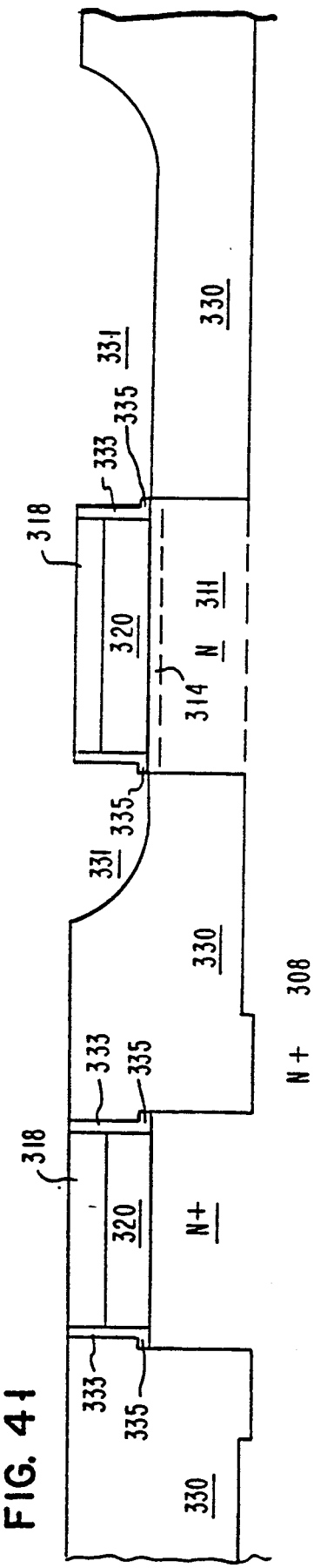

In FIG. 41, well 331 is etched to a level is at least sufficient to provide contact to layer 314 in order to provide contact between the intrinsic and extrinsic base regions. Well 331 may be created by either a buffered hydrofluoric acid wet etch or by another suitable etch method such as a highly selective RIE etch.

Figure 42:
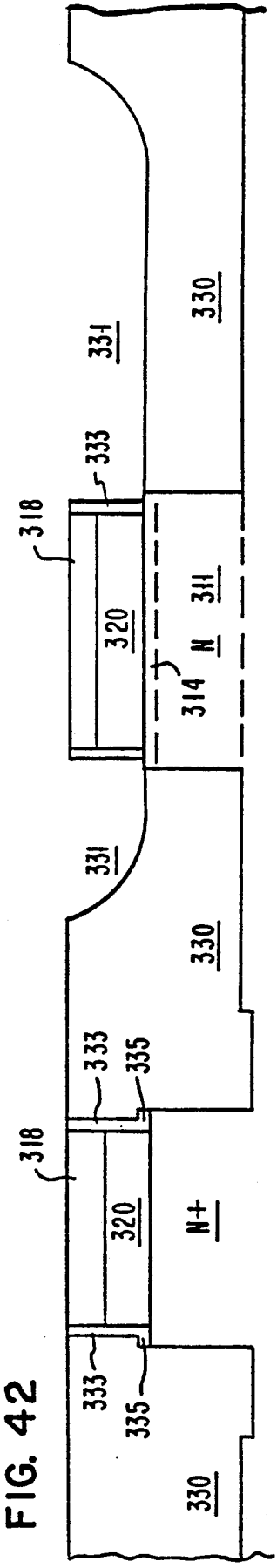

In FIG. 42, pedestal foot 335 is anisotropically etched away using, for example, an anisotropic etch such as RIE. Removal of foot 335 exposes shoulder 344 of base region 314.

Figure 43:
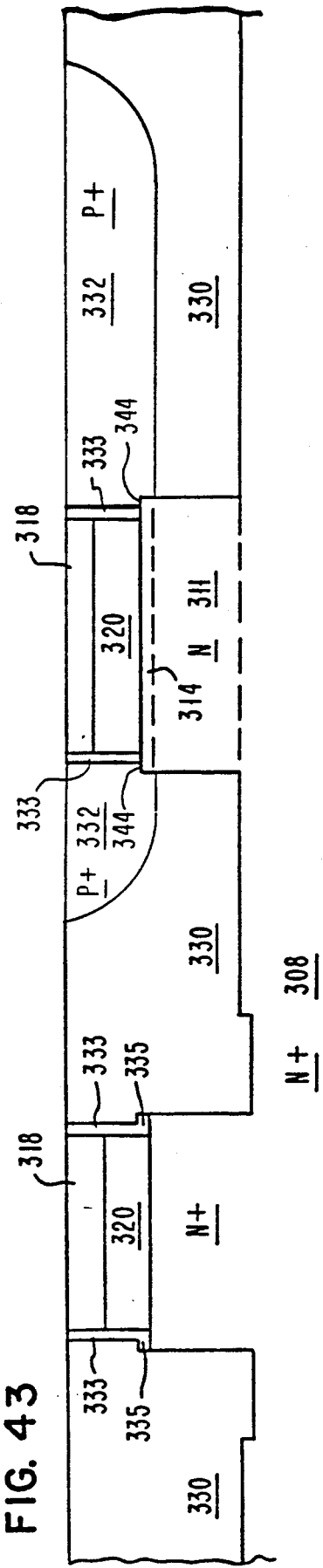

In FIG. 43, an in-situ doped P+ poly layer 332 may be deposited into well 331 to provide an extrinsic base region. Alternatively, undoped poly may be deposited, implanted and annealed. After the deposition of the poly, the device may be planarized using a planarization technique as described above.

Figure 44:
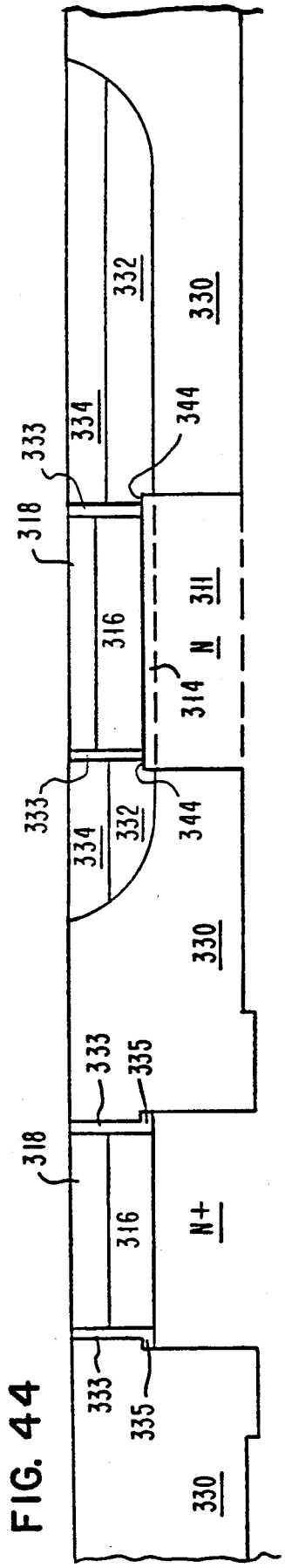

In FIG. 44, P+ polysilicon region 332 is recessed by, for example, an RIE etch. A HIPOX step is used to grow an insulating thermal oxide 334 over region 332. HIPOX allows the growth of the oxide without diffusing the base. However, any suitable thermal oxidation process may be used to grow oxide 334.

Figure 45:
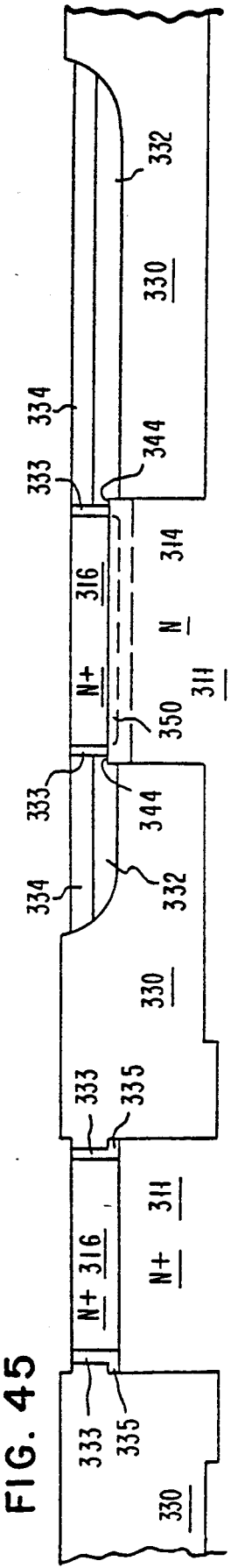

In FIG. 45, an RIE process is used to expose regions 316. Since contact regions 316 are preferably doped polysilicon (e.g., an N+ layer doped with arsenic) emitter region 350 may be formed, as was described with respect to FIG. 9.

Figure 46:
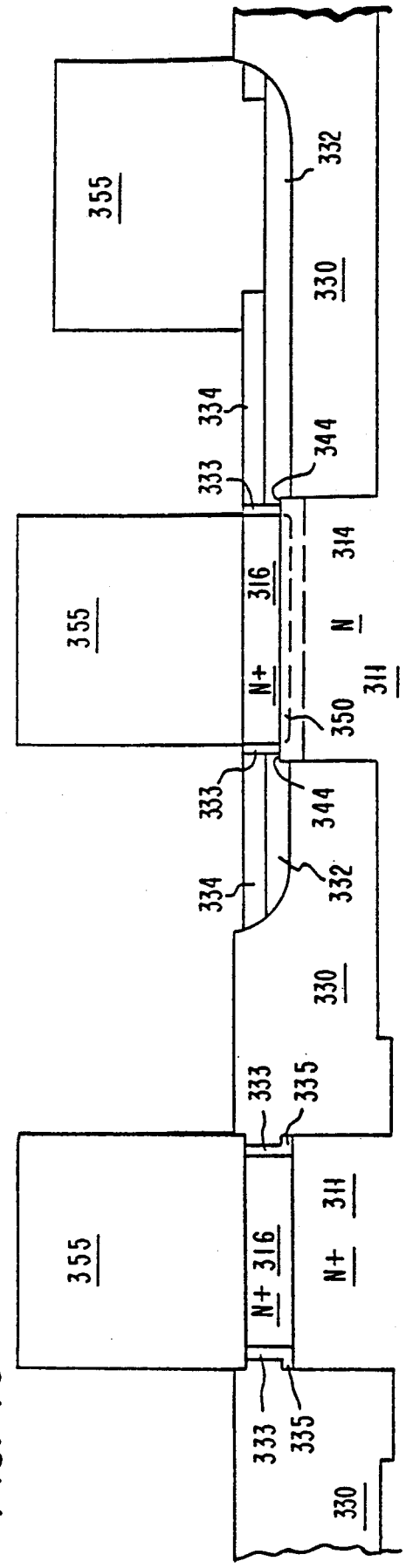

In FIG. 46, contact to extrinsic base region 332 is made by lithographically defining a contact opening and etching region 334 to region 332 using an RIE step. Metal contacts may then be formed using known lithographic techniques over collector contact 316, emitter contact 316 and extrinsic base region 332.

Figure 25:
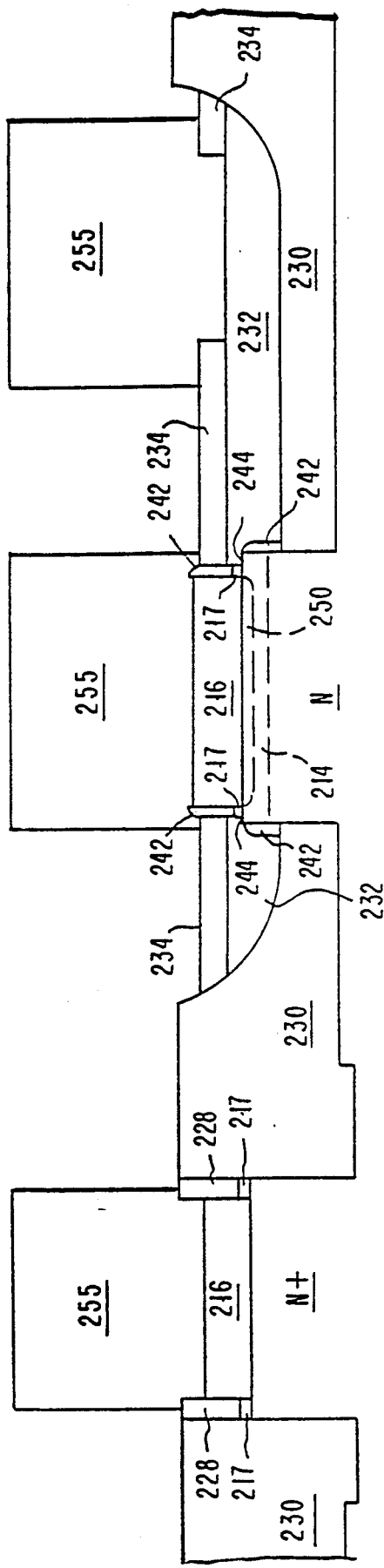
FIG. 25 is a further embodiment of the present invention constructed utilizing the HIPOX process.
Figure 26:
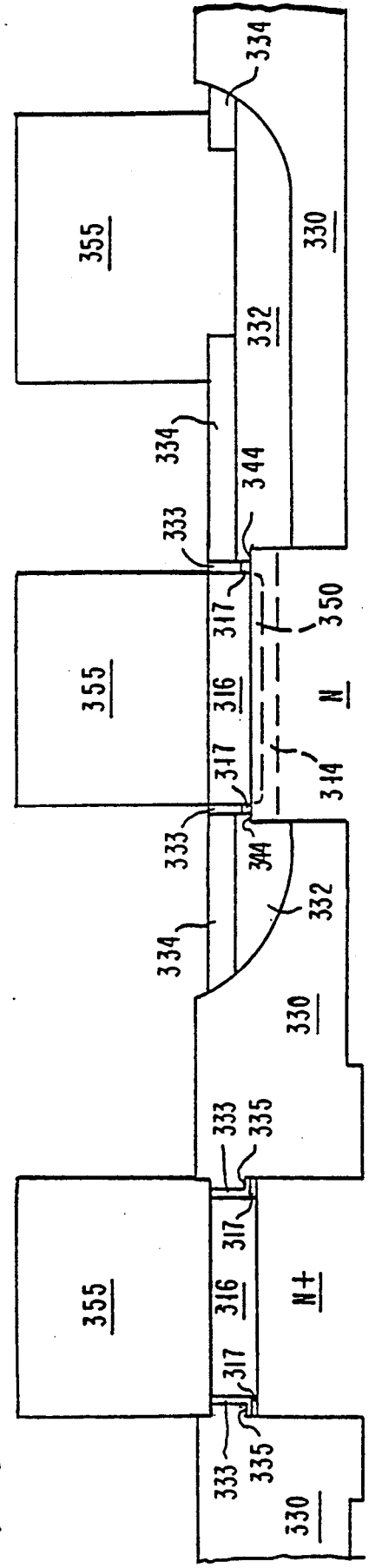
FIG. 26 is a further embodiment of the present invention constructed utilizing the HIPOX process.

It will be obvious from the teaching of the present invention that the the HIPOX option, illustrated in FIGS. 11-22, may be used to manufacture the devices illustrated in either FIG. 36 (See FIG. 25) or FIG. 45 (See FIG. 26) with only minor modifications in the process and resulting structure which will be readily apparent to one of ordinary skill in the art from the description herein, and that such a device is intended to be within the scope of the present invention.

A high-performance fully self-aligned process has been described. The incorporation of low-temperature processing and an epitaxial base results in a thin, heavily doped base despite the fact that the base was deposited early in the process.

In short, reducing lateral dimensions with optical lithography is difficult and not much is gained without concurrently reducing alignment tolerances. For bipolar transistors the alignment tolerance is particularly important since it determines the parasitic capacitances and resistances, and thus directly affects speed. In this application a new, fully self-aligned transistor structure is presented that self-aligns the shallow trench, extrinsic base contact, and the emitter polysilicon to the intrinsic device area. The structure has no critical alignments. To insure extrinsic/intrinsic base linkup, the intrinsic base is put in early in the process, conserved during the stack etch, and patterned underneath the sidewall during the silicon mesa etch. Unlike other mesa-like transistor structures, no out-diffusion of the extrinsic base is required and, therefore, low-temperature processing can be used to maintain a narrow vertical profile.

One advantageous aspect of the present process is the low-temperature processing of the extrinsic base polysilicon contact. All LPCVD polysilicon processes lead to an interfacial oxide between the polysilicon and the silicon mesa. This oxide must be "broken" down to reduce the resistance of this interface by a thermal anneal. However, in this invention, no additional drive-in is required to diffuse the extrinsic base dopant and link-up to the intrinsic base. In the case of an N+ polysilicon emitter, the anneal used to reduce emitter resistance is more than adequate for this extrinsic base contact. No additional extrinsic base anneal is required. Because the field isolation area is self-aligned to the intrinsic device, the extrinsic base contact area is very small, substantially reducing extrinsic base/collector capacitance over prior art devices.

In a further advantageous aspect of the present process, a thin, heavily doped base is achieved by using an epitaxial base and low-temperature processing. A $1 \times 10^{19}$ doped epitaxial base is deposited prior to the initial stack depositions. All thermal oxidations are done in a wet ambient at or below 800° C. The highest temperature in the process is an 850° C. emitter anneal.

While preferred embodiments of the present invention have been shown and described herein, it will be obvious to those skilled in the art that such embodiments are provided by wa of example only. Numerous variations, changes, and substitutions will occur to those skilled in the art without departing from the invention. Accordingly, it is intended that the invention be limited only by the spirit and scope of the appended claims.

We claim:

1. A process for manufacturing a self-aligned bipolar transistor comprising the steps of:

forming a first layer of semiconductor material of a first conductivity type;

forming a second layer of semiconductor material of a second conductivity type over said first layer;

forming a mesa structure over said second layer;

forming a sidewall deposition layer on said mesa structure by depositing a layer of an insulating material and anisotropically etching the layer;

etching a first shallow trench in said first and second layers surrounding said mesa structure, wherein said mesa structure and said sidewall deposition layer form an etch mask;

filling said first shallow trench with an isolation material;

etching a second shallow trench in said isolation material surrounding said mesa structure, wherein said mesa structure and said sidewall deposition layer form an etch mask; and filling said shallow trench with a material of said second conductivity type.

2. The process of claim 1 wherein:

said mesa structure comprises at least a first layer polysilicon doped with said first conductivity type material.

3. The process of claim 1 wherein:

said second layer is formed by epitaxially depositing a layer of semiconductor material using a low-temperature process.

4. The process of claim 1 wherein:

said first layer is a collector comprised of a layer of n-type doped silicon;

said second layer is an intrinsic base layer comprised of a layer of p-type material;

said second shallow trench is filled with an extrinsic base material comprised of a layer of p+ type material;

said mesa comprises a first polysilicon emitter contact layer comprised of a layer of n+ type material which is covered by a series of sacrificial layers.

5. The process of claim 1 wherein said mesa structure is formed by the process of:

depositing a first layer of emitter contact material;

depositing a first sacrificial layer;

depositing a second sacrificial layer;

depositing a third sacrificial layer;

depositing a layer of resist material;

removing the layer of resist material not covering the mesa structure; and etching away the first, second and third sacrificial layers, along with the emitter contact layer in the regions external to the mesa.

6. A process for manufacturing a self-aligned bipolar transistor comprising the steps of:

forming a first layer of semiconductor material of a first conductivity type;

forming a second layer of semiconductor material of a second conductivity type over said first layer;

forming a third layer over said second layer;

forming a mesa structure over said third layer;

forming a sidewall deposition layer on said mesa structure by depositing a layer of an insulating material and anisotropically etching the layer;

etching a first shallow trench in said first, second and third layers surrounding said mesa structure, wherein said mesa structure and said sidewall deposition layer form an etch mask;

filling said first shallow trench with an isolation material;

etching a second shallow trench in said isolation material surrounding said mesa structure, wherein said mesa structure and said sidewall deposition layer form an etch mask; and filling said shallow trench with a material of said second conductivity type.

7. The process of claim 6 wherein:

said mesa structure comprises at least a first layer of polysilicon doped with said first conductivity type material.

8. The process of claim 6 wherein:

said second layer is formed by epitaxially depositing a layer of semiconductor material using a low-temperature process.

9. The process of claim 6 wherein:

said first layer is a collector comprised of a layer of n-type doped silicon;

said second layer is an intrinsic base layer comprised of a layer of p-type silicon;

said third layer is an etch stop layer comprising SiO$_2$;

said second shallow trench is filled with an extrinsic base material comprised of a layer of p+ type silicon;

said mesa comprises a first polysilicon emitter contact layer comprised of a layer of n type material which is covered by a series of sacrificial layers.

10. The process of claim 6 wherein said mesa structure is formed by the process of:

depositing a first layer of emitter contact material;

depositing a first sacrificial layer;

depositing a second sacrificial layer;

depositing a third sacrificial layer;

depositing a layer of resist material;

removing the layer of resist material not covering the mesa structure; and etching away the first, second and third sacrificial layers, along with the emitter contact layer in the regions external to the mesa.

11. A process for manufacturing a self-aligned bipolar transistor comprising the steps of:

forming a first layer of semiconductor material of a first conductivity type;

forming a second layer of semiconductor material of a second conductivity type over said first layer;

forming a mesa structure over said second layer;

forming a first sidewall deposition layer on said mesa structure by depositing a layer of an insulating material and anisotropically etching the layer;

etching a first shallow trench in said first and second layers surrounding said mesa structure, wherein said mesa structure and said sidewall deposition layer form an etch mask;

filling said first shallow trench with an isolation material;

etching a second shallow trench in said isolation material surrounding said mesa structure, wherein said mesa structure and said first deposition layer form an etch mask;

etching said first sidewall deposition layer from said mesa;

forming a first thin sidewall deposition layer on said mesa, wherein said thin sidewall deposition layer is thinner than said first sidewall deposition layer;

forming a second thin sidewall deposition layer on a portion of said first and second layers exposed by the etching of said second shallow trench; and filling said shallow trench with a material of said second conductivity type.

12. The process of claim 11 wherein:

said mesa structure comprises at least a first layer polysilicon doped with said first conductivity type material.

13. The process of claim 11 wherein:

said second layer is formed by epitaxially depositing a layer of semiconductor material using a low-temperature process.

14. The process of claim 11 wherein:

said first layer is a collector comprised of a layer of n-type doped silicon;

said second layer is an intrinsic base layer comprised of a layer of p-type material;

said second shallow trench is filled with an extrinsic base material comprised of a layer of p+ type material;

said mesa comprises a first polysilicon emitter contact layer comprised of a layer of n+ type material which is covered by a series of sacrificial layers.

15. The process of claim 11 wherein said mesa structure is formed by the process of:

depositing a first layer of emitter contact material;

depositing a first sacrificial layer;

depositing a second sacrificial layer;

depositing a third sacrificial layer;

depositing a layer of resist material;

removing the layer of resist material not covering the mesa structure; and etching away the first, second and third sacrificial layers, along with the emitter contact layer in the regions external to the mesa.

16. A process for manufacturing a self-aligned bipolar transistor comprising the steps of:

forming a first layer of semiconductor material of a first conductivity type;

forming a second layer of semiconductor material of a second conductivity type over said first layer;

forming a third layer over said second layer;

forming a mesa structure over said third layer;

forming a first sidewall deposition layer on said mesa structure by depositing a layer of an insulating material and anisotropically etching the layer;

etching a first shallow trench in said first, second and third layers surrounding said mesa structure, wherein said mesa structure and said sidewall deposition layer form an etch mask;

filling said first shallow trench with an isolation material;

etching a second shallow trench in said isolation material surrounding said mesa structure, wherein said mesa structure and said first sidewall deposition layer form an etch mask;

etching said first sidewall deposition layer from said mesa;

forming a first thin sidewall deposition layer on said mesa, wherein said thin sidewall deposition layer is thinner than said first sidewall deposition layer;

forming a second thin sidewall deposition layer on a portion of said first and second layers exposed by the etching of said second shallow trench; and filling said shallow trench with a material of said second conductivity type.

17. The process of claim 16 wherein:
said mesa structure comprises at least a first layer polysilicon doped with said first conductivity type material.

18. The process of claim 16 wherein:
said second layer is formed by epitaxially depositing a layer of semiconductor material using a low-temperature process.

19. The process of claim 16 wherein:
said first layer is a collector comprised of a layer of n-type doped silicon;
said second layer is an intrinsic base layer comprised of a layer of p-type material;
said third layer is an etch stop layer comprising $SiO_2$
said second shallow trench is filled with an extrinsic base material comprised of a layer of p+ type material;
said mesa comprises a first polysilicon emitter contact layer comprised of a layer of n+ type material which is covered by a series of sacrificial layers.

20. The process of claim 16 wherein said mesa structure is formed by the process of:
depositing a first layer of emitter contact material;
depositing a first sacrificial layer;
depositing a second sacrificial layer;
depositing a third sacrificial layer;
depositing a layer of resist material;
removing the layer of resist material not covering the mesa structure; and
etching away the first, second and third sacrificial layers, along with the emitter contact layer in the regions external to the mesa.

21. A process for manufacturing a self-aligned bipolar transistor comprising the steps of:
forming a first layer of semiconductor material of a first conductivity type;
forming a second layer of semiconductor material of a second conductivity type over said first layer;
forming a mesa structure over said second layer;
depositing a first sidewall deposition layer over said mesa structure and said second layer;
depositing a second sidewall deposition layer over said first sidewall deposition layer;
anisotropically etching said first and second sidewall deposition layers to form a pedestal structure covered by a sidewall on said mesa structure, wherein said pedestal comprises a vertical portion and a horizontal portion extending from said vertical portion;

etching a first shallow trench in said first and second conductivity type layers surrounding said mesa structure, wherein said mesa structure, said pedestal and said sidewall deposition form an etch mask;

filling said first shallow trench with an isolation material;

etching a second shallow trench in said isolation material surrounding said mesa structure, wherein said sidewall is removed and wherein said pedestal and said mesa structure form an etch mask; anisotropically etching said pedestal to remove said horizontal portion; and filling said shallow trench with a material of said second conductivity type.

22. The process of claim 21 wherein:
said mesa structure comprises at least a first layer polysilicon doped with said first conductivity type material.

23. The process of claim 21 wherein:
said second layer is formed by epitaxially depositing a layer of semiconductor material using a low-temperature process.

24. The process of claim 21 wherein:
said first layer is a collector comprised of a layer of n-type doped silicon;
said second layer is an intrinsic base layer comprised of a layer of p-type material;
said second sidewall layer and said isolation material comprise $SiO_2$;
said second shallow trench is filled with an extrinsic base material comprised of a layer of p+ type material;
said mesa comprises a first polysilicon emitter contact layer comprised of a layer of n+ type material which is covered by a series of sacrificial layers.

25. The process of claim 21 wherein said mesa structure is formed by the process of:
depositing a first layer of emitter contact material;
depositing a first sacrificial layer;
depositing a second sacrificial layer;
depositing a third sacrificial layer;
depositing a layer of resist material;
removing the layer of resist material not covering the mesa structure; and
etching away the first, second and third sacrificial layers, along with the emitter contact layer in the regions external to the mesa.

26. A process for manufacturing a self-aligned bipolar transistor comprising the steps of:
forming a first layer of semiconductor material of a first conductivity type;
forming a second layer of semiconductor material of a second conductivity type over said first layer;
forming a third layer over said second layer;
forming a mesa structure over said third layer;
depositing a first sidewall deposition layer over said mesa structure and said third layer;
depositing a second sidewall deposition layer over said first sidewall deposition layer;
anisotropically etching said first and second sidewall deposition layers to form a pedestal structure covered by a sidewall on said mesa structure, wherein said pedestal comprises a vertical portion and a horizontal portion extending from said vertical portion;
etching a first shallow trench in said first, second and third layers surrounding said mesa structure, wherein said mesa structure, said pedestal and said sidewall deposition form an etch mask;

filling said first shallow trench with an isolation material;

etching a second shallow trench in said isolation material surrounding said mesa structure, wherein said sidewall is removed and said pedestal and said mesa structure form an etch mask;

anisotropically etching said pedestal to remove said horizontal portion; and filling said shallow trench with a material of said second conductivity type.

27. The process of claim 26 wherein:

said mesa structure comprises at least a first layer polysilicon doped with said first conductivity type material.

28. The process of claim 26 wherein:

said second layer is formed by epitaxially depositing a layer of semiconductor material using a low-temperature process.

29. The process of claim 26 wherein:

said first layer is a collector comprised of a layer of n-type doped silicon;

said second layer is an intrinsic base layer comprised of a layer of p-type material;

said second sidewall layer and said isolation material comprise $SiO_2$;

said second shallow trench is filled with an extrinsic base material comprised of a layer of p+ type material;

said third layer is a layer of etch stop material;

said mesa comprises a first polysilicon emitter contact layer comprised of a layer of n+ type material which is covered by a series of sacrificial layers.

30. The process of claim 26 wherein said mesa structure is formed by the process of:

depositing a first layer of emitter contact material;

depositing a first sacrificial layer;

depositing a second sacrificial layer;

depositing a third sacrificial layer;

depositing a layer of resist material;

removing the layer of resist material not covering the mesa structure; and etching away the first, second and third sacrificial layers, along with the emitter contact layer in the regions external to the mesa.

* * * * *